United States Patent
Kim et al.

(10) Patent No.: US 11,805,639 B2
(45) Date of Patent: Oct. 31, 2023

(54) SEMICONDUCTOR DEVICES

(71) Applicant: Samsung Electronics Co., Ltd., Suwon-si (KR)

(72) Inventors: Euna Kim, Seoul (KR); Keunnam Kim, Yongin-si (KR); Kiseok Lee, Hwaseong-si (KR); Wooyoung Choi, Seoul (KR); Sunghee Han, Hwaseong-si (KR)

(73) Assignee: Samsung Electronics Co., Ltd.

( * ) Notice: Subject to any disclaimer, the term of this patent is extended or adjusted under 35 U.S.C. 154(b) by 107 days.

(21) Appl. No.: 17/372,634

(22) Filed: Jul. 12, 2021

(65) Prior Publication Data

US 2022/0139921 A1 May 5, 2022

(30) Foreign Application Priority Data

Nov. 3, 2020 (KR) .................. 10-2020-0145475

(51) Int. Cl.
*H10B 12/00* (2023.01)
*H01L 23/528* (2006.01)

(52) U.S. Cl.
CPC ......... *H10B 12/315* (2023.02); *H01L 23/528* (2013.01); *H10B 12/0335* (2023.02); *H10B 12/482* (2023.02); *H10B 12/485* (2023.02)

(58) Field of Classification Search
CPC .............. H10B 12/315; H10B 12/0335; H10B 12/482; H10B 12/485; H10B 12/30; H10B 12/03; H01L 23/528

See application file for complete search history.

(56) References Cited

U.S. PATENT DOCUMENTS

| 10,388,657 | B2 | 8/2019 | Wu |
| 2004/0149992 | A1 | 8/2004 | Park et al. |
| 2005/0040448 | A1 | 2/2005 | Park |
| 2005/0106808 | A1 | 5/2005 | Yu et al. |
| 2008/0277708 | A1 | 11/2008 | Mun |
| 2016/0329337 | A1 | 11/2016 | Hwang et al. |
| 2016/0351501 | A1 | 12/2016 | Chun |
| 2018/0166450 | A1* | 6/2018 | Kim ............ H10B 12/033 |

(Continued)

FOREIGN PATENT DOCUMENTS

| KR | 20200079366 A | 7/2020 |
| TW | 200414428 A | 8/2004 |

(Continued)

*Primary Examiner* — Galina G Yushina
(74) *Attorney, Agent, or Firm* — Myers Bigel, P.A.

(57) ABSTRACT

A semiconductor device includes a substrate including an active region, a first bitline structure and a second bitline structure that extend side by side on the substrate, a storage node contact electrically connected to the active region between the first and second bitline structures, a lower landing pad between the first and second bitline structures and on the storage node contact, an upper landing pad in contact with the first bitline structure and electrically connected to the lower landing pad, and a capping insulating layer. A lower surface of the upper landing pad in contact with the first bitline structure and a lower surface of the capping insulating layer in contact with the lower landing pad each include a portion in which a horizontal separation distance is increased from the adjacent upper landing pad in a direction toward the substrate.

19 Claims, 34 Drawing Sheets

(56) References Cited

U.S. PATENT DOCUMENTS

| | | | | |
|---|---|---|---|---|
| 2018/0174971 A1* | 6/2018 | Song | ............... | H10B 12/482 |
| 2019/0067294 A1* | 2/2019 | Lee | ............... | H10B 12/482 |
| 2019/0206873 A1* | 7/2019 | Kim | ............... | H10B 12/315 |
| 2020/0118929 A1 | 4/2020 | Kim et al. | | |
| 2020/0203347 A1* | 6/2020 | Song | ............... | H10B 12/482 |
| 2020/0203354 A1* | 6/2020 | Lee | ............... | H10B 12/053 |
| 2020/0373305 A1 | 11/2020 | Hsu | | |

FOREIGN PATENT DOCUMENTS

| | | | |
|---|---|---|---|
| TW | 200509403 A | 3/2005 |
| TW | 200525732 A | 8/2005 |
| TW | 202044357 A | 12/2020 |

\* cited by examiner

SEMICONDUCTOR DEVICES

CROSS-REFERENCE TO RELATED APPLICATION(S)

This application claims benefit of priority to Korean Patent Application No. 10-2020-0145475 filed on Nov. 3, 2020, in the Korean Intellectual Property Office, the disclosure of which is incorporated by reference herein in its entirety.

BACKGROUND

The present disclosure relates to semiconductor devices.

Due to advances within the electronics industry and user demands, electronic devices have become both smaller in size and higher in performance. Accordingly, it is increasingly desirable that semiconductor devices used in electronic devices increased integration and increased performance. To manufacture highly-scaled semiconductor devices, there is an increasing desire for contact technologies in which stable connections are formed to connect adjacent conductive structures to each other while also reducing electrical resistance between the conductive structures.

SUMMARY

Aspects of the present disclosure provide semiconductor devices having improved electrical characteristics and reliability.

According to some example embodiments, a semiconductor device includes a substrate including a first active region and a second active region, a bitline structure that extends in one direction on the substrate and electrically connected to the first active region, a storage node contact on a sidewall of the bitline structure and electrically connected to the second active region, a spacer structure between the bitline structure and the storage node contact, a lower landing pad on the storage node contact and in contact with a sidewall of the spacer structure, an upper landing pad on the bitline structure, the spacer structure, and the lower landing pad to be electrically connected to the lower landing pad, a capping insulating layer disposed on the lower landing pad and in contact with a sidewall of the upper landing pad, and a capacitor structure on the capping insulating layer and electrically connected to the upper landing pad. The upper landing pad includes a first region that overlaps the bitline structure in a vertical direction, and a second region that overlaps the lower landing pad in the vertical direction, and a lower end of the second region is closer to the substrate than a lower end of the first region.

According to some example embodiments, a semiconductor device includes a substrate including an active region, a first bitline structure and a second bitline structure that extend side by side on the substrate, a storage node contact electrically connected to the active region between the first and second bitline structures, a lower landing pad disposed between the first and second bitline structures and on the storage node contact, an upper landing pad in contact with the first bitline structure and electrically connected to the lower landing pad, and a capping insulating layer in contact with the second bitline structure, the upper landing pad, and the lower landing pad. A lower surface of the upper landing pad in contact with the first bitline structure includes a portion in which a horizontal separation distance is increased from the adjacent capping insulating layer in a direction toward the substrate, and a lower surface of the capping insulating layer in contact with the lower landing pad includes a portion in which a horizontal separation distance is increased from the adjacent upper landing pad in a direction toward the substrate.

According to some example embodiments, a semiconductor device includes: a substrate including at least two first regions and at least two second active regions; at least two bitlines that are spaced apart from each other and that extend side by side on the substrate, and are respectively electrically connected to the at least two first active regions; at least two bitline capping patterns, respectively disposed on the at least two bitlines; spacer structures on sidewalls of the bitlines and sidewalls of the bitline capping patterns; at least two storage node contacts between the spacer structures, and respectively electrically connected to the at least two second active regions; lower landing pads, respectively on the storage node contacts; upper landing pads, respectively electrically connected to the lower landing pads; and a capping insulating layer between the upper landing pads and having a lower end in contact with upper surfaces of the spacer structures. At least some of the upper landing pads include a first region, in contact with the bitline capping pattern and having a lower end at a first vertical depth from an upper surface, and a second region in contact with the lower landing pad and having a lower end at a second vertical depth, greater than the first depth, from the upper surface.

BRIEF DESCRIPTION OF DRAWINGS

The above and other aspects, features, and advantages of the present disclosure will be more clearly understood from the following detailed description, taken in conjunction with the accompanying drawings.

FIG. 2A illustrates cross-sections, respectively taken along lines I-I' and II-II' of FIG. 1, and FIG. 2B illustrates cross-sections, respectively taken along lines III-III' and IV-IV' of FIG. 1.

FIG. 3 is an enlarged view of a region including the landing pad structure of FIG. 2A.

FIG. 15 illustrates cross-sections, respectively taken along lines V-V' and VI-VI' of FIG. 14.

DETAILED DESCRIPTION

Hereinafter, some example embodiments will be described with reference to the accompanying drawings.

Figure 1:
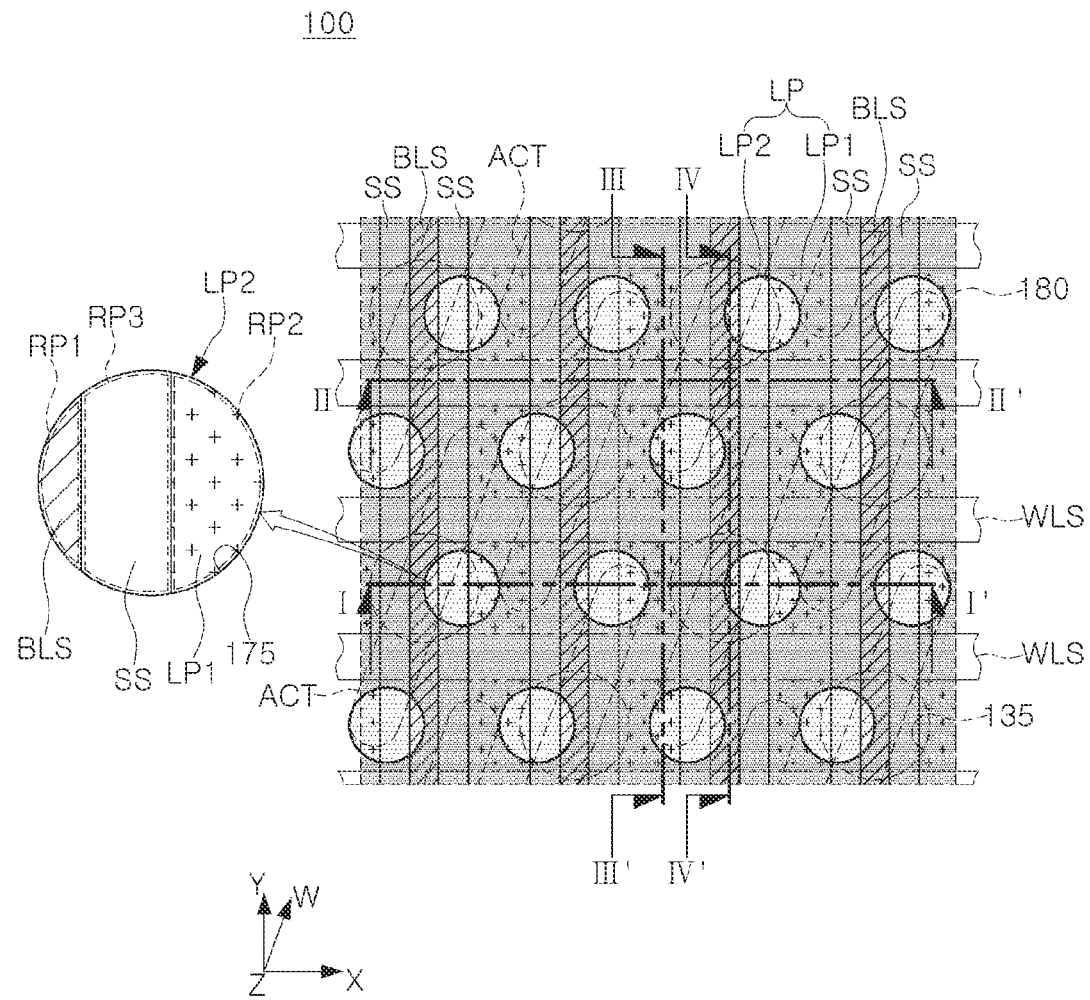
FIG. 1 is a schematic layout diagram of a semiconductor device according to some example embodiments.
Figure 2A:
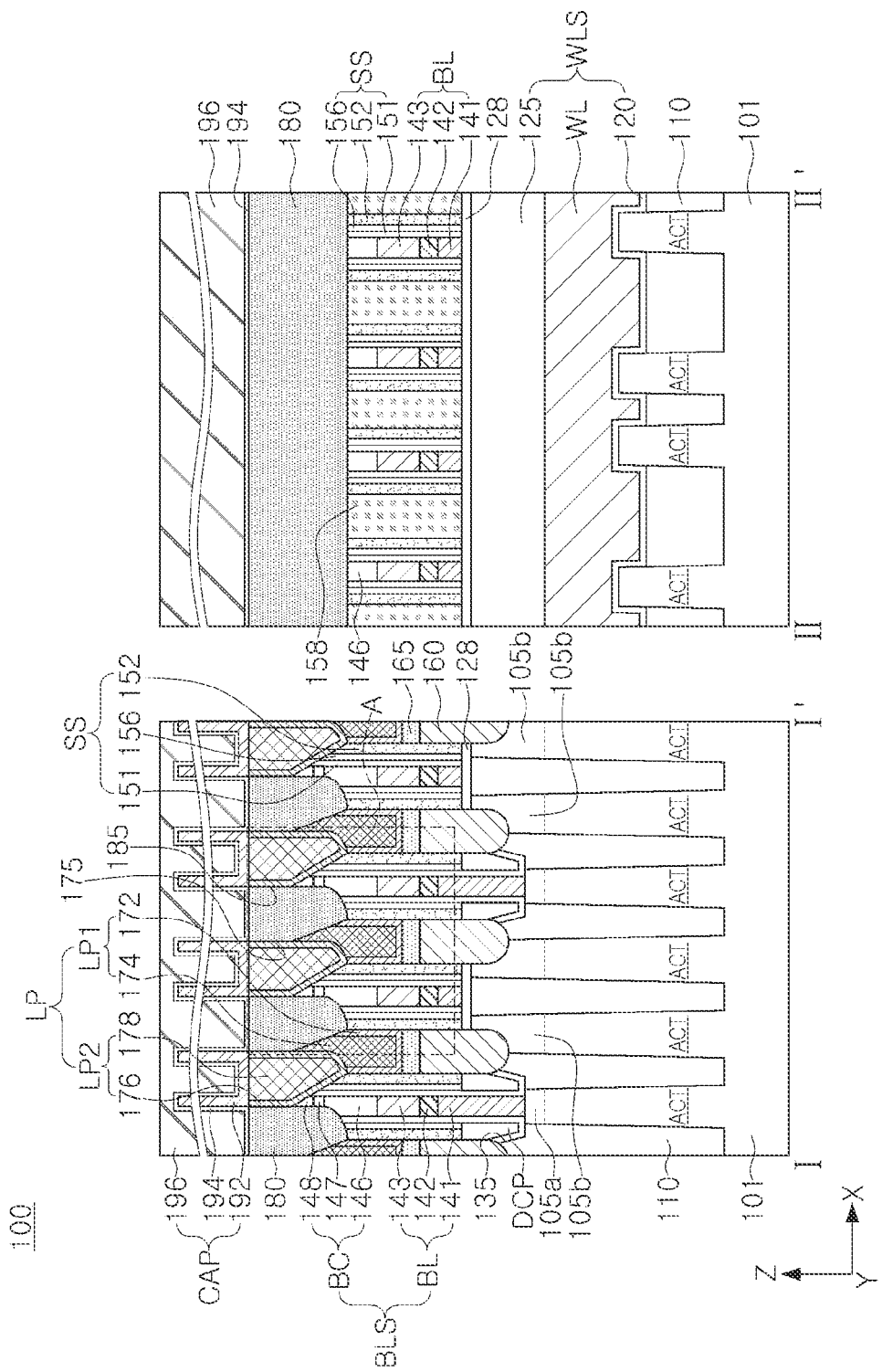
FIGS. 2A and 2B are schematic cross-sectional views of a semiconductor device according to some example embodiments.
Figure 2B:
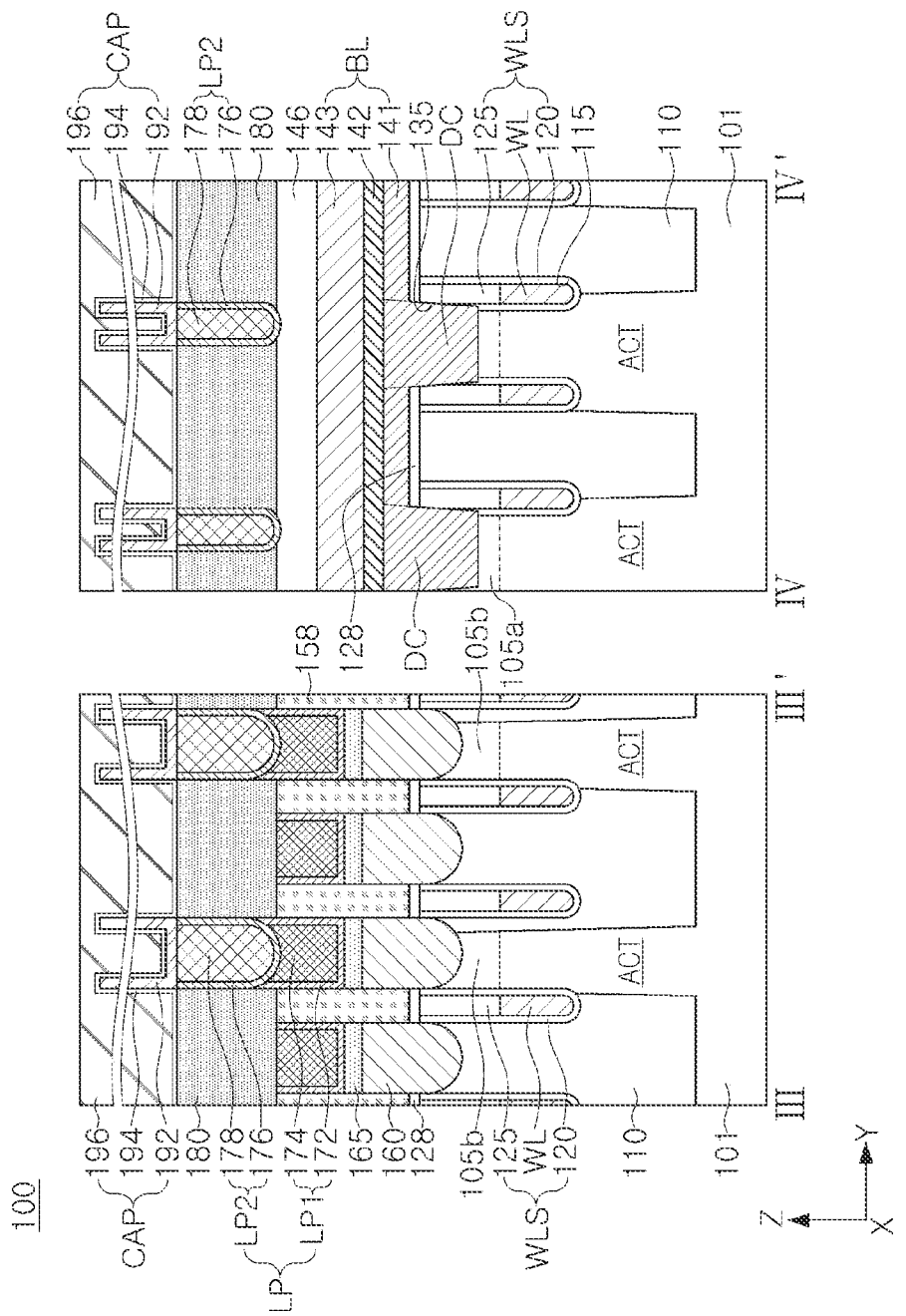
Figure 3:
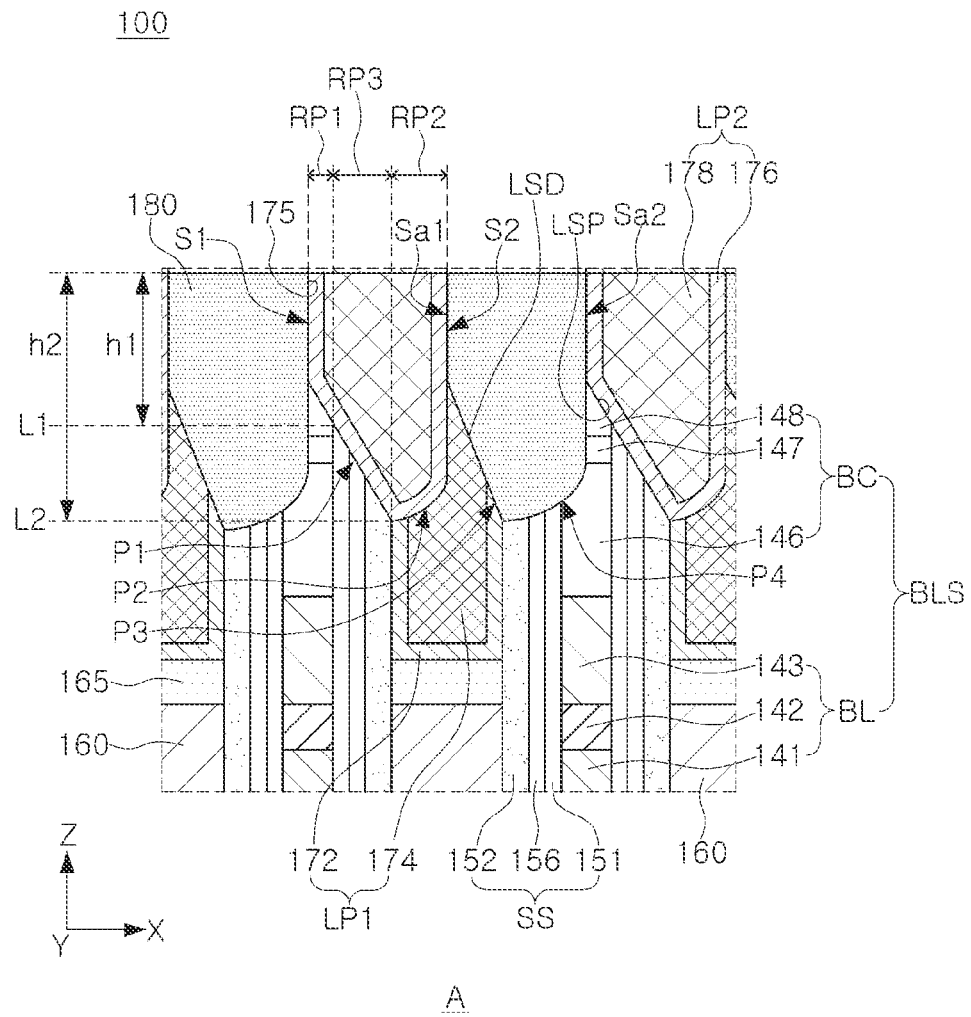
FIG. 3 is a partially enlarged cross-sectional view of a semiconductor device according to some example embodiments.
Figure 4:
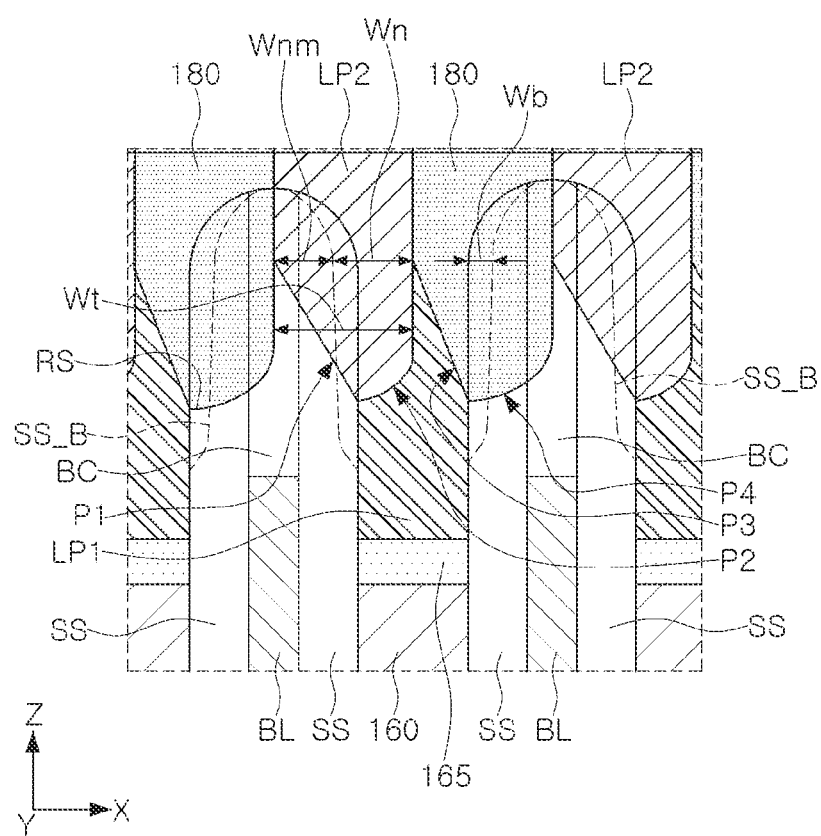
FIG. 4 is a view illustrating a landing pad structure of a semiconductor device according to some example embodiments.

FIG. 1 is a schematic layout diagram of a semiconductor device according to some example embodiments. FIGS. 2A and 2B are schematic cross-sectional views of a semiconductor device according to some example embodiments. FIG. 2A illustrates cross-sections, respectively taken along lines I-I' and II-II' of FIG. 1, and FIG. 2B illustrates cross-sections, respectively taken along lines III-III' and IV-IV' of FIG. 1. FIG. 3 is a partially enlarged cross-sectional view of a semiconductor device according to example embodiments. FIG. 3 is an enlarged view of region "A" including the landing pad structure of FIG. 2A. FIG. 4 is a view illustrating a landing pad structure of a semiconductor device according to some example embodiments.

Referring to FIGS. 1 to 4, a semiconductor device 100 may include a substrate 101, wordline structures WLS, bitline structures BLS, capacitor structures CAP, storage node contacts 160, landing pad structures LP, and a capping insulating layer 180. The substrate 101 may include active regions ACT. The wordline structures WLS may be buried in the substrate 101, and may extend in a first direction (e.g., an X direction). The wordline structures WLS may include wordlines WL. The bitline structures BLS may be on the substrate 101 and may extend in a second direction (e.g., a Y direction) that intersects the first direction. The capacitor structures CAP may be above the bitline structures BLS in a third direction (e.g., a Z direction, which may be a vertical direction). The storage node contacts 160 may electrically connect the capacitor structures CAP and the active regions ACT to each other. The landing pad structures LP may electrically connect the storage node contacts 160 and the capacitor structures CAP to each other. The capping insulating layer 180 may be on the bitline structures BLS.

The semiconductor device 100 may further include device isolation layers 110 defining the active regions ACT, an interlayer insulating layer 128 on the substrate 101, spacer structures SS on opposite sides of the bitlines structures BLS, a metal-semiconductor layer 165 on the storage node contact 160, and insulating patterns 158 between the bitline structures BLS. The semiconductor device 100 may be applied to, for example, a cell array of a dynamic random access memory (DRAM), but the present disclosure is not limited thereto. Each of the landing pad structures LP may include a lower landing pad LP1 and an upper landing pad LP2.

The substrate 101 may have an upper surface extending in the first (X) direction and the second (Y) direction. The substrate 101 may include a semiconductor material such as a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be a silicon substrate, a silicon-on-insulator (SOI) substrate, a germanium substrate, a germanium-on-insulator (GOI) substrate, a silicon-germanium substrate, or a substrate including an epitaxial layer.

The active regions ACT may be defined in the substrate 101 by the device isolation layers 110. Each active region ACT may have a bar shape, and may be in the form of an island extending in a fourth direction, for example, in a W direction. The fourth or W direction may be inclined or angled from the directions in which wordlines WL and bitlines BL extend.

The active region ACT may have first and second impurity regions 105a and 105b, each having a predetermined depth from an upper surface of the substrate 101. The first and second impurity regions 105a and 105b may be spaced apart from each other. The first and second impurity regions 105a and 105b may be provided as source/drain regions of a transistor including wordlines WL. For example, a drain region may be formed between two wordlines WL crossing a single active region ACT, and a source region may be formed outside the two wordlines WL. The source region and the drain region are formed in the first and second impurity regions 105a and 105b by doping substantially the same impurities or implanting ions, and are interchangeably referred to depending on a circuit configuration of an ultimately formed transistor. The impurities may include dopants having a conductivity type opposite to a conductivity type of the substrate 101. In some example embodiments, the first and second impurity regions 105a and 105b may have different depths in the source region and the drain region.

The device isolation layer 110 may be formed by a shallow trench isolation (STI) process. The device isolation layer 110 may electrically insulate the active regions ACT from each other while surrounding the active regions ACT. The device isolation layer 110 may be formed of an insulating material and may include, for example, an oxide, a nitride, or a combination thereof. In some example embodiments, the device isolation layer 110 may include a plurality of layers.

Each of the wordline structures WLS may include a gate dielectric layer 120, a wordline WL, and a buried insulating layer 125.

The wordlines WL may be in gate trenches 115 extending within the substrate 101. The wordlines WL may be extend in the first (X) direction across the active regions ACT in the substrate 101. A pair of wordlines WL (e.g., first and second wordlines WL) may extend across one active region ACT. The wordlines WL may constitute a buried channel array transistor (BCAT), but the present disclosure is not limited thereto. In some example embodiments, the wordlines WL may be above the substrate 101 and may be not completely buried therein.

The wordline WL may be in the gate trench 115 and may have a predetermined thickness. An upper surface of the wordline WL may be positioned on a level lower than the upper surface of the substrate 101. In relation to the term "level" used in the present specification, a high level and a low level may be defined based on and/or relative to a substantially planar upper surface of the substrate 101. The wordline WL may include a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al), although the present disclosure is not limited to these examples. In some example embodiments, the wordline WL may include a plurality of layers.

The gate dielectric layer 120 may be on a bottom surface and on internal side surfaces of the gate trench 115. The gate dielectric layer 120 may cover and conform to an internal wall of the gate trench 115. The gate dielectric layer 120 may include at least one of an oxide, a nitride, and an oxynitride. The gate dielectric layer 120 may be, for example, a silicon oxide layer or an insulating layer having a high-k dielectric constant. In some example embodiments, the gate dielectric layer 120 may be formed by oxidation of the active region ACT, or may be formed by deposition.

The buried insulating layer 125 may be above the wordline WL and may fill an upper portion of the gate trench 115. An upper surface of the buried insulating layer 125 may be on the substantially the same level as the upper surface of the substrate 101. The buried insulating layer 125 may be formed of an insulating material, for example, a silicon nitride.

The storage node contacts 160 may be connected to one region of the active region ACT, for example, the second impurity region 105b. As illustrated in FIG. 1, the storage node contacts 160 may be between bitline structures BLS adjacent to each other in the first (X) direction, in particular, between spacer structures SS on opposite sides of the bitline structures BLS, when viewed in a plan view. Each of the storage node contacts 160 may be between wordline structures WLS and between bitline structures BLS, when viewed in a plan view. Each of the storage node contacts 160 may fill a space defined by bitline structures BLS adjacent to each other in the first (X) direction and insulating patterns 158 adjacent to each other in the second (Y) direction. The storage node contacts 160 may be arranged in columns and rows in the first (X) direction and the second (Y) direction.

The storage node contacts 160 may penetrate through the interlayer insulating layer 128, and may electrically connect the second impurity region 105b and the capacitor structure CAP of the active region ACT to each other. The storage node contacts 160 may be in direct contact with the second impurity region 105b. A lower end of the storage node contact 160 may be on a level lower than the upper surface of the substrate 101, and the lower end of the storage node contact 160 may be on a level higher than a lower surface of a bitline contact pattern DC. The storage node contact 160 may be insulated from the bitline contact pattern DC by a bitline contact spacer DCP.

The storage node contact 160 may be formed of a conductive material, for example, polycrystalline silicon (Si), titanium (Ti), titanium nitride (TiN), tantalum (Ta), tantalum nitride (TaN), tungsten (W), tungsten nitride (WN), and aluminum (Al), although the present disclosure is not limited to these examples. In some example embodiments, the storage node contact 160 may include a plurality of layers.

The metal-semiconductor layer 165 may be between the storage node contact 160 and the lower landing pad LP1. The metal-semiconductor layer 165 may cover an upper surface of the storage node contact 160. The metal-semiconductor layer 165 may be, for example, a layer formed by siliciding a portion of the storage node contact 160. For example, the metal-semiconductor layer 165 may include cobalt silicide (CoSi), titanium silicide (TiSi), nickel silicide (NiSi), tungsten silicide (WSi), or another metal silicide. In some example embodiments, the metal-semiconductor layer 165 is optional and may be omitted.

The lower landing pad LP1 may be between a pair of bitline structures BLS and on the storage node contact 160. The lower landing pad LP1 may cover an upper surface of the metal-semiconductor layer 165. The lower landing pad LP1 may be in contact with sidewalls of the spacer structures SS between the spacer structures SS. The lower landing pad LP1 may have an asymmetrical shape due to a structure arranged thereon. The asymmetrical shape may refer to a shape in which first and second sides (e.g., left and right sides) are different with respect to a central axis of a component in one cross-section of the semiconductor device 100.

The lower landing pad LP1 may include a first conductive layer 174 and a first barrier layer 172 covering lower surfaces and side surfaces of the first conductive layer 174. The first barrier layer 172 may cover sidewalls of the spacer structure SS and an upper surface of the metal-semiconductor layer 165. The first conductive layer 174 may include a conductive material, for example, at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN). The first barrier layer 172 may include at least one of a metal nitride, for example, titanium nitride (TiN), tantalum nitride (TaN), and tungsten nitride (WN).

The upper landing pads LP2 may be on the lower landing pads LP1 and may electrically connect the storage node contacts 160 to respective capacitor structures CAP, respectively. The upper landing pads LP2 may be in the contact holes 175, may penetrate through the capping insulating layer 180, and may be electrically connected to respective lower landing pads LP1. The upper landing pads LP2 may be arranged in a different type of pattern than the storage node contacts 160, as illustrated in FIG. 1, such that the storage node contacts 160 and the capacitor structures CAP, having different arrangements on a plane, may be connected to each other. Specifically, when viewed in a plan view, the lower landing pads LP1 may be arranged in a grid pattern that forms a square, and the upper landing pads LP2 may be arranged in a grid pattern that forms a hexagonal shape or a honeycomb shape. Such an arrangement of the upper landing pads LP2 may correspond to the arrangement of the capacitor structures CAP, so that the upper landing pads LP2 may be formed on the bitline structure BLS, the spacer structure SS, and the lower landing pad LP1.

The upper landing pad LP2 may have an asymmetrical shape in a cut surface (for example, a cross-section taken along line I-I') of the semiconductor device 100. The asymmetrical shape may prevent a bridge being formed between adjacent upper landing pads LP2, and/or may prevent a necking defect in which a width of the upper landing pad LP2 is decreased in a certain region of the upper landing pad LP2 or the upper landing pad LP2 is divided into an upper portion and a lower portion when the upper landing pads LP2 are formed. Hereinafter, the asymmetrical shape of the upper landing pad LP2 will be described in greater detail.

As illustrated in the enlarged view of FIG. 1 and FIG. 3, the upper landing pad LP2 may include a first region RP1, a second region RP2, and a third region RP3. The first region RP1 may overlap the bitline structure BLS in the third (Z) direction, the second region RP2 may overlap the lower landing pad LP1 in the third (Z) direction, and the third region RP3 may overlap with the spacer structure SS in the third (Z) direction. As illustrated in FIG. 3, the lower end L2 of the second region RP2 may be on a level lower than a lower end L1 of the first region RP1. For example, the lower end L1 of the first region RP1 may be at a first vertical depth h1 from an upper surface of the upper landing pad LP2, and the lower end L2 of the second region RP2 may be at a second vertical depth h2 from an upper surface of the upper landing pad LP2. In some example embodiments, the second vertical depth h2 may be greater than the first vertical depth h1. In some example embodiments, a portion of a lower surface of the third region RP3 may be on a level between the lower end L1 of the first region RP1 and the lower end L2 of the second region RP2. The lower end L1 of the first region RP1 of the upper landing pad LP2 may be in contact with a bitline capping pattern BC. A lowermost portion of the upper landing pad LP2 may be in contact with the lower landing pad LP1.

As illustrated in FIG. 3, the first and second regions RP1 and RP2 of the upper landing pad LP2 may include a first sidewall S1 and a second sidewall S2, respectively, with the first sidewall S1 and the second sidewall S2 facing each other. The first sidewall S1 and the second sidewall S2 may be parallel or substantially parallel to each other. A lower surface LSP of the upper landing pad LP2 may connect the first sidewall S1 and the second sidewall S2 to each other in a lower portion of the upper landing pad LP2. The lower surface LSP may include a first portion P1 in which a vertical depth of the upper landing pad LP2 is decreased in a direction toward the lower landing pad LP1. The first portion P1 of the lower surface LSP of the upper landing pad LP2 may have a slope or downward incline, but the present disclosure is not limited thereto. According to some example embodiments, the first portion P1 of the lower surface LSP of the upper landing pad LP2 may include a curved portion. The first portion P1 of the lower surface LSP of the upper landing pad LP2 may be in contact with the bitline capping pattern BC of the bitline structure BLS. The first portion P1 of the lower surface LSP of the upper landing pad LP2 may also be in contact with the spacer structure SS, and may be connected to the first sidewall S1. A horizontal separation distance between the first portion P1 of the lower surface LSP of the upper landing pad LP2 and the capping insulating layer 180 adjacent to the first sidewall S1 of the upper landing pad LP2 may be increased in a downward direction.

The lower surface LSP of the upper landing pad LP2 may further include a second portion P2 connected to the second sidewall S2. The second portion P2 of the lower surface LSP of the upper landing pad LP2 may be in contact with the lower landing pad LP1, and may be curved or convex outwardly of the lower landing pad LP1. According to some embodiments, the second portion P2 of the lower surface LSP of the upper landing pad LP2 may include at least one of a portion having a slope and a curved portion.

The upper landing pad LP2 may include a second conductive layer 178 and a second barrier layer 176 covering a lower surface and side surfaces of the second conductive layer 178. The second barrier layer 176 may be in contact with the bitline structure BLS, the spacer structure SS, the lower landing pad LP1, and sidewalls Sa1 and Sa2 of the capping insulating layer 180. The second conductive layer 178 may include the same conductive material as the first conductive layer 174. The second barrier layer 176 may include the same metal nitride as the first barrier layer 172. According to some example embodiments, the first and second barrier layers 172 and 176 may be omitted.

The capping insulating layer 180 may be on the lower landing pad LP1 to be in contact with the sidewall of the upper landing pad LP2. The capping insulating layer 180 may be arranged to be in contact with the bitline structure BLS, the spacer structure SS, the upper landing pad LP2, and the lower landing pad LP1. The capping insulating layer 180 may be between the upper landing pads LP2. The capping insulating layer 180 may have a lower end in contact with an upper surface of the spacer structure SS. The lower end of the capping insulating layer 180 may be on a level lower than an upper end of the bitline capping pattern BC.

The capping insulating layer 180 may have an asymmetrical shape in a cut surface of the semiconductor device 100 (for example, a cross-section taken along line I-I'). The asymmetrical shape may prevent a bridge being formed between adjacent upper landing pads LP2, or a necking defect in which a width is decreased in a certain region of the upper landing pad LP2 when the upper landing pads LP2 are formed.

As illustrated in FIG. 3, the capping insulating layer 180 may have a first sidewall Sa1 and a second sidewall Sa2 facing each other between the upper landing pads LP2. The first sidewall Sa1 of the capping insulating layer 180 may be in contact with the second sidewall S2 of the upper landing pad LP2. The lower surface LSD of the capping insulating layer 180 may connect the first sidewall Sa1 and the second sidewall Sa2 in a lower portion of the capping insulating layer 180. The lower surface LSD of the capping insulating layer 180 may include a first portion P3 in which a vertical depth of the capping insulating layer 180 is decreased in a direction toward the lower landing pad LP1. The first portion P3 of the lower surface LSD of the capping insulating layer 180 may be downwardly inclined or sloped from the first sidewall Sa1 of the capping insulating layer 180 in contact with the second sidewall S2 of the upper landing pad LP2. However, the present disclosure is not limited thereto, and the first portion P3 of the lower surface LSD of the capping insulating layer 180 may include a curved portion. The first portion P3 of the lower surface LSD of the capping insulating layer 180 may be in contact with the lower landing pad LP1, and may be connected to the first sidewall Sa1 of the capping insulating layer 180. A horizontal separation distance between the first portion P3 of the lower surface LSD of the capping insulating layer 180 and the upper landing pad LP in contact with the first sidewall Sa1 of the capping insulating layer 180 may be increased in a downward direction.

The lower surface LSD of the capping insulating layer 180 may further include a second portion P4 connected to the second sidewall Sa2. The second portion P4 may be a curved surface of the lower surface LSD of the capping insulating layer 180, and may be in contact with the bitline capping pattern BC and the spacer structure SS. The second portion P4 of the lower surface LSD of the capping insulating layer 180 may be convex outward. According to some example embodiments, the second portion P4 of the lower surface LSD of the capping insulating layer 180 may include at least one of a portion having a slope and a curved portion.

Referring to FIG. 4, structures of an upper landing pad LP2 and a capping insulating layer 180 of FIG. 3 are illustrated to be compared with those of a Comparative Example. In FIG. 4, some configurations of a semiconductor device are illustrated in brief. The upper landing pad LP2 may be formed by negative etching and deposition, and the capping insulating layer 180 may be formed by positive etching using the upper landing pad LP2 as an etching mask and deposition. The capping insulating layer 180 may be self-aligned between the upper landing pads LP2 by positive etching.

In the Comparative Example, a bowl spacer structure SS_B may be formed by a process of decreasing a horizontal thickness of an upper portion of a spacer structure SS, and then a conductive material layer that forms an upper landing pad may be deposited and patterned to separate upper landing pads from each other. In this case, a portion of the upper landing pad may be formed to have a first width Wn in the first (X) direction. The first width Wn should be secured to form the upper landing pads in a stable manner. However, when the first width Wn is increased, a bridge may be formed due to connection between adjacent upper landing pads in the X direction. Meanwhile, when the first width Wn is decreased, a necking defect, in which a thickness of an upper landing pad is decreased to divide the upper landing pad into an upper portion and a lower portion or a width of the upper landing pad is locally decreased, may occur.

According to some example embodiments, since the upper landing pad LP2 may be formed to have a third width Wt, greater than the first width Wn by a second width Wnm, by negative etching, the landing pad LP2 may be more stably formed without the necking defect and contact resistance may be significantly reduced. Since a lower surface of the upper landing pad LP2 includes a first portion P1 in contact with a bitline capping pattern BC and a spacer structure SS and a second portion P2 in contact with a lower landing pad LP1, a contact area with the lower landing pad LP1 may be increased to significantly reduce contact resistance.

In addition, even when the first width Wn is increased or the upper landing pads LP2 are misaligned, a bowl spacer structure SS_B may not be formed, so that a width of the spacer structure SS may be decreased. Accordingly, since a width of the spacer structure SS may be further secured by a fourth width Wb, electrical separation between adjacent upper landing pads LP2 in the X direction may be achieved.

According to some example embodiments, a positive etching process may be performed using the upper landing pads LP2 as a mask, and then a capping insulating layer 180 may be formed in a recess regions RS. Thus, electrical separation between the upper landing pads LP2 may be further achieved.

In addition, the capping insulating layer 180 may be formed such that a lower surface thereof includes a first portion P3 having a horizontal separation distance, from an adjacent upper landing pad LP2, decreased in a downward direction. Thus, an additional necking defect may be effectively prevented from occurring due to a decrease in size of a lower portion of the upper landing pad LP2, for example, a second portion P2 during positive etching. In addition, an additional bridge may be effectively prevented from being formed when conductive residues of another adjacent upper landing pad LP2 are connected to the second portion P2 of the upper landing pad LP2.

Referring again to FIGS. 1 to 4, the bitline structures BLS may extend in the second (Y) direction, and may be perpendicular to wordlines WL. The bitline structures BLS may include a bitline BL and a bitline capping pattern BC on the bitline BL.

The bitline BL may include a first conductive pattern 141, a second conductive pattern 142, and a third conductive pattern 143, which may be sequentially stacked. The bitline capping pattern BC may be on the third conductive pattern 143. An interlayer insulating layer 128 may be between the first conductive pattern 141 and the substrate 101, and a portion of the first conductive pattern 141 (hereinafter, referred to as the bitline contact pattern DC) may be in contact with a first impurity region 105a of an active region ACT. The bitline BL may be electrically connected to the first impurity region 105a through the bitline contact pattern DC. A lower surface of the bitline contact pattern DC may be on a level lower than an upper surface of a substrate 101, and may be on a level higher than an upper surface of the wordlines WL. In some example embodiments, the bitline contact pattern DC may be formed in the substrate 101 to be arranged in a bitline contact hole 135 that exposes the first impurity region 105a.

The first conductive pattern 141 may include a semiconductor material such as polycrystalline silicon. The first conductive pattern 141 may be in direct contact with the first impurity region 105a. The second conductive pattern 142 may include a metal-semiconductor compound. The metal-semiconductor compound may be, for example, a layer formed by siliciding a portion of the first conductive pattern 141. For example, the metal-semiconductor compound may include cobalt silicide (CoSi), titanium silicide (TiSi), nickel silicide (NiSi), tungsten silicide (WSi), or another metal silicide. The third conductive pattern 143 may include a metal material such as titanium (Ti), tantalum (Ta), tungsten (W), and aluminum (Al). The number, type of material, and/or stacking order of conductive patterns, constituting the bitline BL, may be changed in various manners according to various embodiments, and accordingly the present disclosure is not limited to the above examples.

The bitline capping pattern BC may include a first capping pattern 146, a second capping pattern 147, and a third capping pattern 148, which may be sequentially stacked on the third conductive pattern 143. Each of the first to third capping patterns 146, 147, and 148 may include an insulating material, for example, a silicon nitride. The first to third capping patterns 146, 147, and 148 may be formed of different materials. When the first to third capping patterns 146, 147, and 148 include the same material, boundaries therebetween may be formed depending on a difference in physical properties. A thickness of the second capping pattern 147 may be smaller than a thickness of the first capping pattern 146 and a thickness of the third capping pattern 148. The number and/or type of material of the capping patterns, constituting the bitline capping pattern BC, may be changed in various manners according to various embodiments, and accordingly the present disclosure is not limited to the above examples.

The bitline contact spacer DCP may fill the remainder of the bitline contact hole 135 in which the bitline contact pattern DC is formed. A bitline contact spacer DCP may cover a portion of the first spacer 151 that extends into the bitline contact hole 135. The bitline contact spacer DCP may be on opposite sidewalls of the bitline contact pattern DC. In some example embodiments, the bitline contact spacer DCP may surround side surfaces of the bitline contact pattern DC. The bitline contact spacer DCP may be formed of an insulating material having etch selectivity with respect to the interlayer insulating layer 128. The bitline contact spacer DCP may include a silicon oxide, a silicon nitride, a silicon oxynitride, or combinations thereof.

The spacer structures SS may be on opposite sidewalls of each of the bitline structures BLS to extend in one direction, for example, the second (Y) direction. The spacer structures SS may be between the bitline structure BLS and a storage node contact 160. The spacer structures SS may extend along sidewalls of the bitline BL and sidewalls of the bitline capping pattern BC. A pair of spacer structures SS, on opposite sides of one bitline structure BLS, may be asymmetrical with respect to the bitline structure BLS.

The spacer structure SS may include a first spacer 151, a second spacer 152, and an air spacer 156.

The first spacers 151 may be on sidewalls of the bitline structures BLS. The second spacer 152 may be between the first spacer 151 and the storage node contact 160. The air spacer 156 may be defined between the first spacer 151 and the second spacer 152. An upper end of the air spacer 156 may be defined by the capping insulating layer 180 on the air spacer 156, or may be defined by the upper landing pad LP2. In some example embodiments, a portion of the capping insulating layer 180 may extend between the first and second spacers 151 and 152 to define the upper end of the air spacer 156.

The insulating patterns 158 may be spaced apart from each other in one direction, for example, the second (Y) direction between the bitline structures BLS to be arranged on the interlayer insulating layer 128. The insulating patterns 158 may overlap the wordline structures WLS, when viewed in a plan view. The insulating patterns 158 may be formed of an insulating material having etch selectivity with respect to the interlayer insulating layer 128. For example, the insulating patterns 158 may include a silicon nitride.

The capacitor structures CAP may be on the insulating patterns 158 to be in contact with the upper landing pad LP2. The capacitor structures CAP may include a lower electrode 192, a capacitor dielectric layer 194, and an upper electrode 196. The lower electrode 192 and the upper electrode 196 may include at least one of a doped semiconductor, a metal nitride, a metal, and a metal oxide. The lower electrode 192 and the upper electrode 196 may include, for example, at least one of polycrystalline silicon, titanium nitride (TiN), tungsten (W), titanium (Ti), ruthenium (Ru), and tungsten nitride (WN). The capacitor dielectric layer 194 may include at least one of high-k dielectric materials such as zirconium oxide ($ZrO_2$), aluminum oxide ($Al_2O_3$), and hafnium oxide ($Hf_2O_3$). In FIGS. 2A and 2B, the capacitor structure CAP is illustrated as having a cylindrical shape, but the present disclosure is not limited thereto. In some example embodiments, the capacitor structure CAP may have a pillar shape.

Figure 5A:
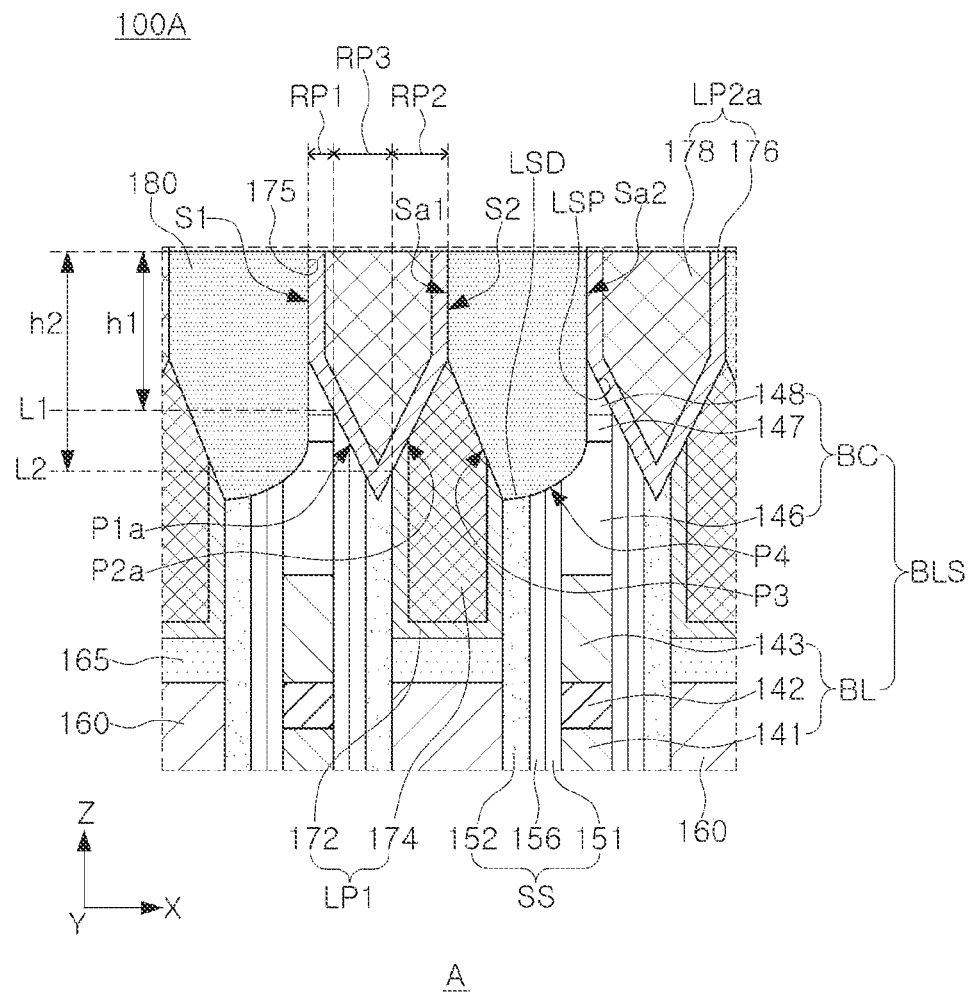
FIGS. 5A to 5C are partially enlarged cross-sectional views of a semiconductor device according to some example embodiments.
Figure 5B:
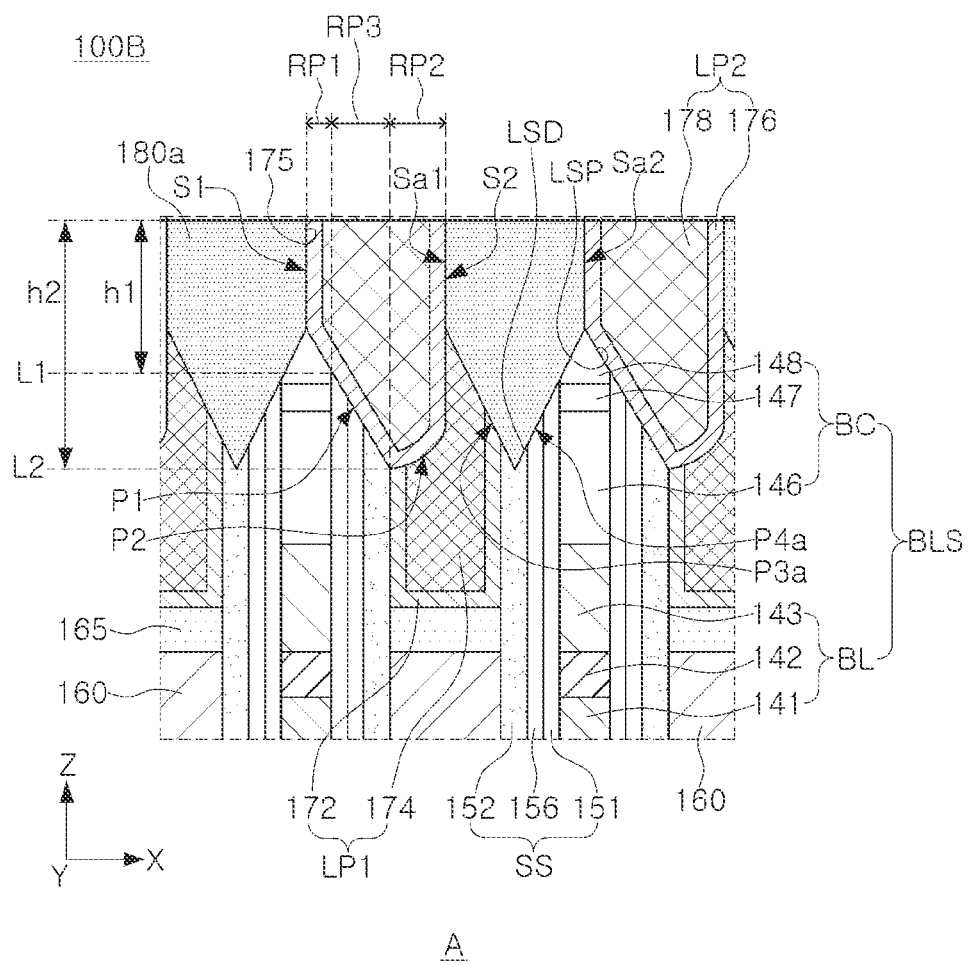
Figure 5C:
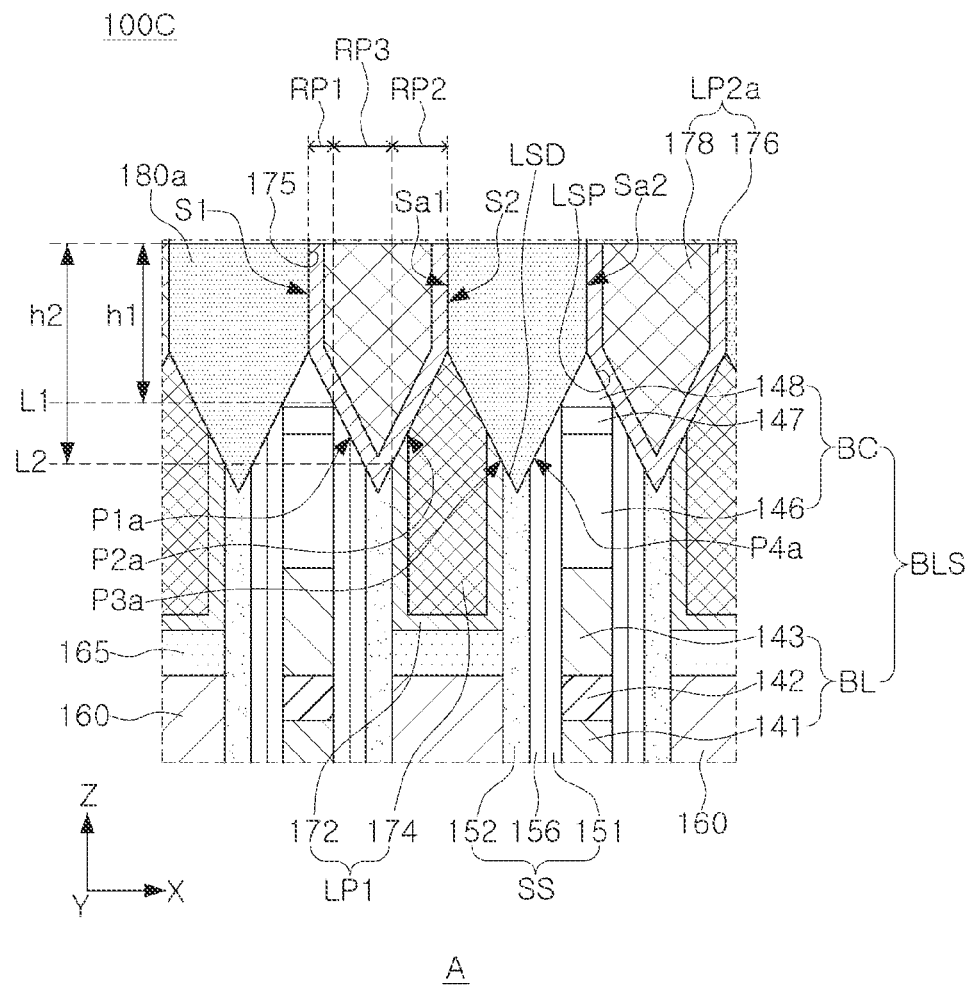

FIGS. 5A to 5C are partially enlarged cross-sectional views of a semiconductor device according to some example embodiments. FIGS. 5A to 5C illustrate regions, each corresponding to the region "A" including the landing pad structure of FIG. 2A.

Referring to FIG. 5A, an upper landing pad LP2a of a semiconductor device 100A may a symmetrical shape and may have a lower portion having a sharp or pointed shape downward toward a substrate 101. A lower surface LSP of the upper landing pad LP2a may include a first portion P1a having a slope, as in the example embodiments of FIGS. 1 to 4, and may include a second portion P2a connected to the first portion P1a and a second sidewall S2 and having a slope. The second portion P2a of the lower surface LSP of the upper landing pad LP2a may be in contact with a lower landing pad LP1. The upper landing pad LP2a may have a lowermost end at a point at which the first portion P1a and the second portion P2a intersect each other. The lowermost end may be in contact with, for example, the lower landing pad LP1. According to the degree of alignment of the upper landing pad LP2a and/or conditions of an etching process, a location and a shape of the lowermost end of the upper landing pad LP2a are not limited to those illustrated in the drawings and may be changed in various manners and according to various embodiments. For example, the lower surface LSP of the upper landing pad LP2a may be a curved surface convex downward toward the substrate 101. The descriptions of the example embodiments in FIGS. 1 to 4 may be equally applied to the lower ends L1 and L2 of the first region RP1 and the second region RP2 of the upper landing pad LP2a. In the semiconductor device 100, the capping insulating layer 180 may be the same as that in the example embodiment of FIG. 3. The upper landing pads LP2a may be formed more stably and electrical separation between the upper landing pads LP2a may be achieved by a first portion P1a and a second portion P2a of the upper landing pads LP2a and a first portion P3 and a second portion P4 of the capping insulating layer 180.

Referring to FIG. 5B, a capping insulating layer 180a of a semiconductor device 100B may have a symmetrical shape between upper landing pads LP2 and have a lower portion having a sharp or pointed shape downward toward the substrate 101. A lower surface LSD of the capping insulating layer 180a may include a first portion P3a and a second portion P4a, each having a slope. The first portion P3a may be connected to a first sidewall Sa1, and the second portion P4a may be connected to a second sidewall Sa2. The capping insulating layer 180a may have a lowermost end at a point at which the first portion P3a and the second portion P4a intersect each other. The lowermost end may be in contact with, for example, a spacer structure SS. According to the degree of alignment of the upper landing pad LP2 and/or conditions of an etching process, a location and a shape of the lowermost end are not limited to those illustrated in the drawing, and may be changed in various manners and according to various embodiments. In the semiconductor device 100, the upper landing pads LP2 may be the same as that in the example embodiment of FIG. 3. The upper landing pads LP2 may be formed more stably and electrical separation between the upper landing pads LP2 may be achieved by first and second portions P1 and P2 of the upper landing pads LP2 and the first and second portions P3a and P4a of the capping insulating layer 180a.

Referring to FIG. 5C, an upper landing pad LP2a of a semiconductor device 100C may have a symmetrical shape and may have a lower portion pointed downward, as in the example embodiment of FIG. 5A, and a capping insulating layer 180a may have a symmetrical shape between upper landing pads LP2a and may have a lower portion having a sharp shape downward, as in the example embodiment of FIG. 5B.

Figure 6A:
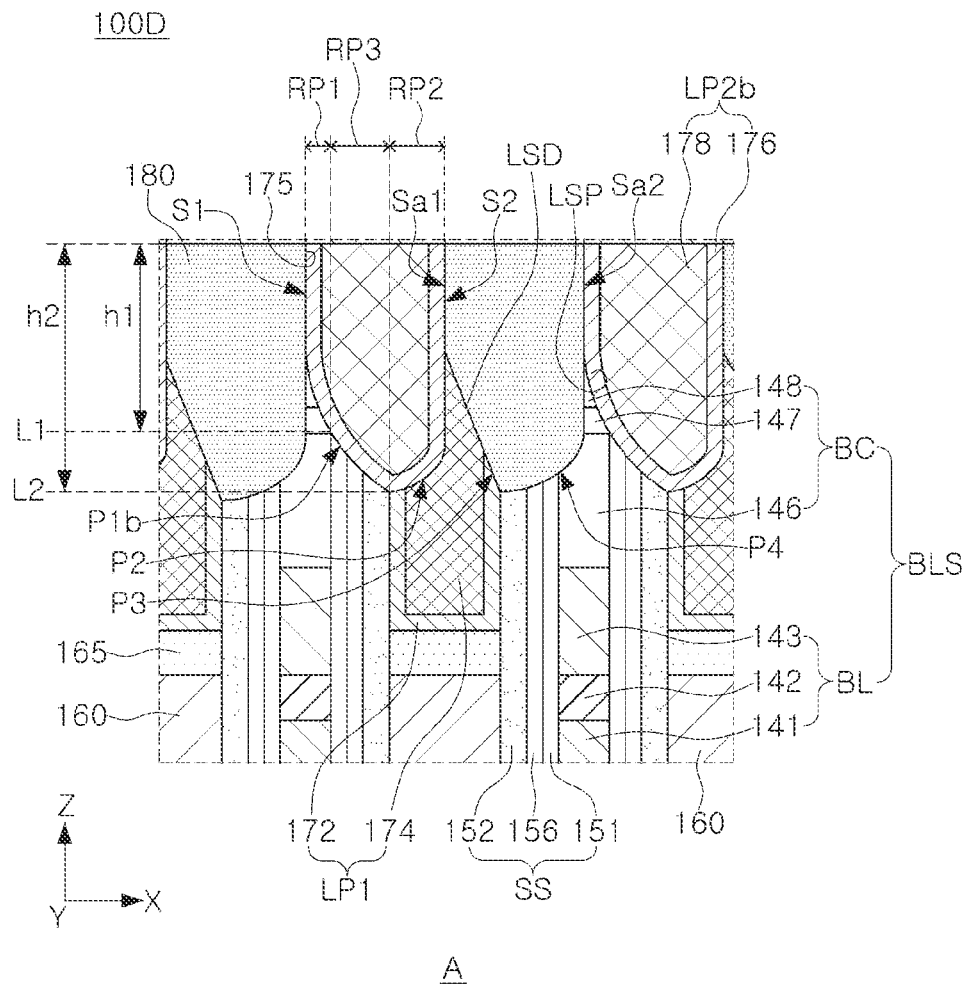
FIGS. 6A to 6C are partially enlarged cross-sectional views of a semiconductor device according to some example embodiments.
Figure 6B:
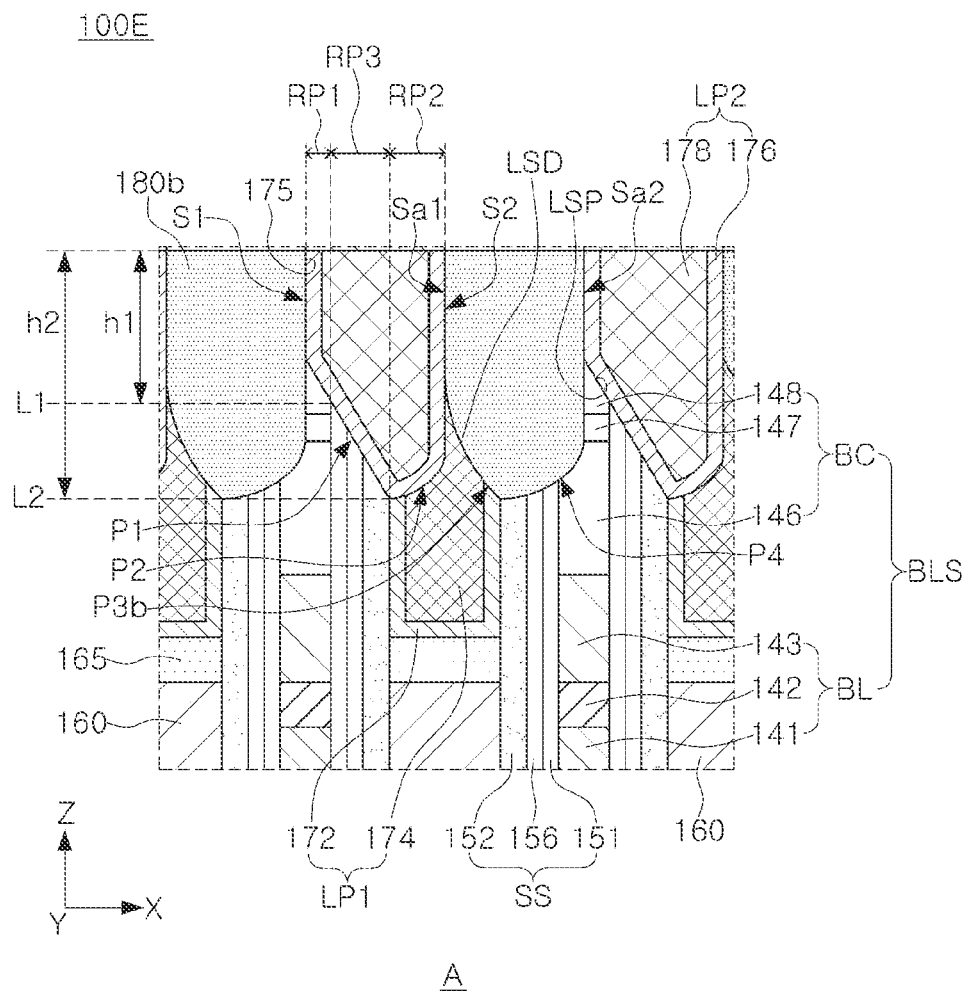
Figure 6C:
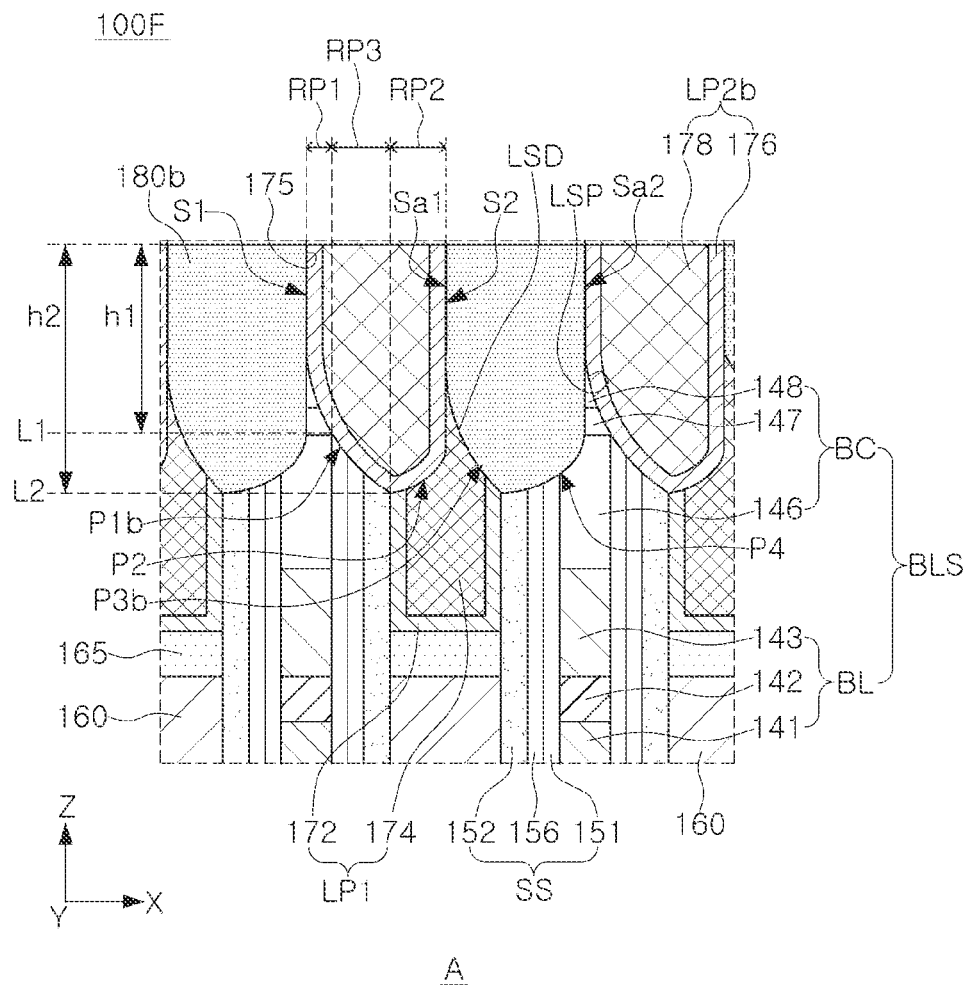

FIGS. 6A to 6C are partially enlarged cross-sectional views of a semiconductor device according to some example embodiments. FIGS. 6A to 6C illustrate regions, each corresponding to the region "A" including the landing pad structure of FIG. 2A.

Referring to FIG. 6A, a first portion P1b of a lower surface LSP of an upper landing pad LP2b of a semiconductor device 100D may include a curved portion. The curved portion of a first portion P1b of the lower surface LSP of the upper landing pad LP2b may be convex outwardly of the upper landing pad LP2b toward a bitline capping pattern BC. Accordingly, since the upper landing pad LP2b having a greater width may be formed, the above-described necking defect may be effectively prevented.

Referring to FIG. 6B, a first portion P3b of a lower surface LSD of a capping insulating layer 180b of a semiconductor device 100E may include a curved portion. The curved portion of the first portion P3b of the lower surface LSD of the capping insulating layer 180b may be convex outwardly of the capping insulating layer 180b toward a lower landing pad LP1. Such a shape of the capping insulating layer 180b may depend on the degree of alignment of the upper landing pad LP2 and/or conditions of an etching process.

Referring to FIG. 6C, a first portion P1b of a lower surface LSP of an upper landing pad LP2b of a semiconductor device 100F may include a curved portion, as in the example embodiment of FIG. 6A, and a first portion P3b of a lower surface LSD of a capping insulating layer 180b may include a curved portion, as in the example embodiment of FIG. 6B.

FIGS. 7A to 13C are schematic plan views and schematic cross-sectional views illustrating a method of manufacturing a semiconductor device according to some example embodiments.

Figure 7A:
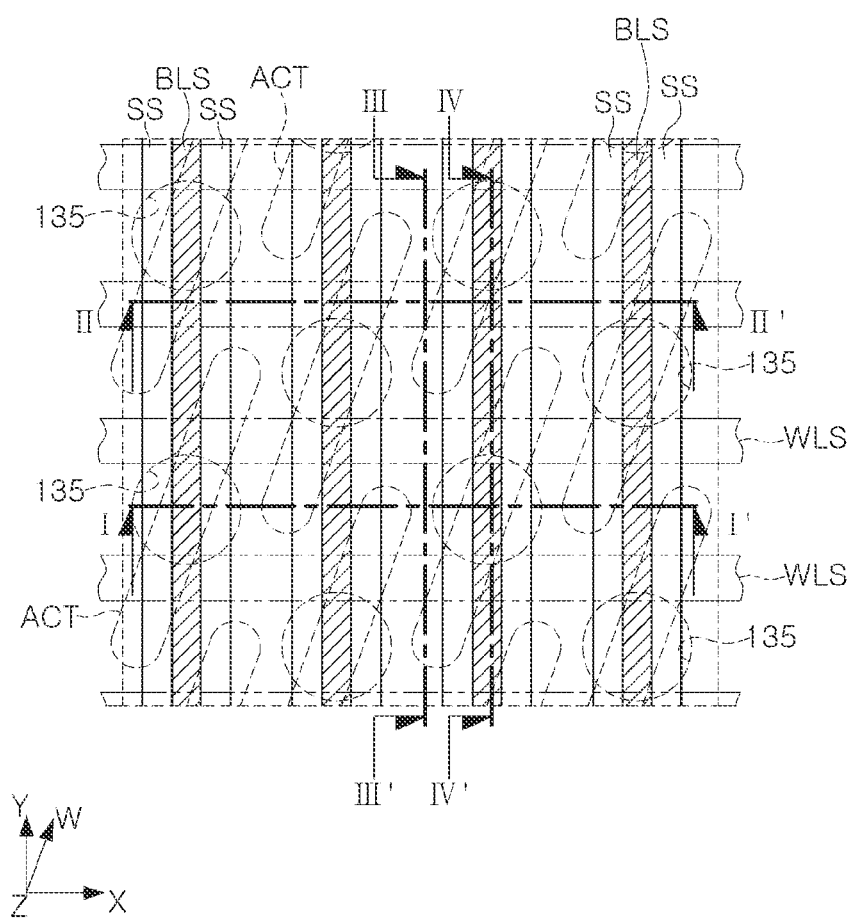
FIGS. 7A to 13C are schematic plan views and schematic cross-sectional views illustrating a method of manufacturing a semiconductor device according to some example embodiments.
Figure 7B:
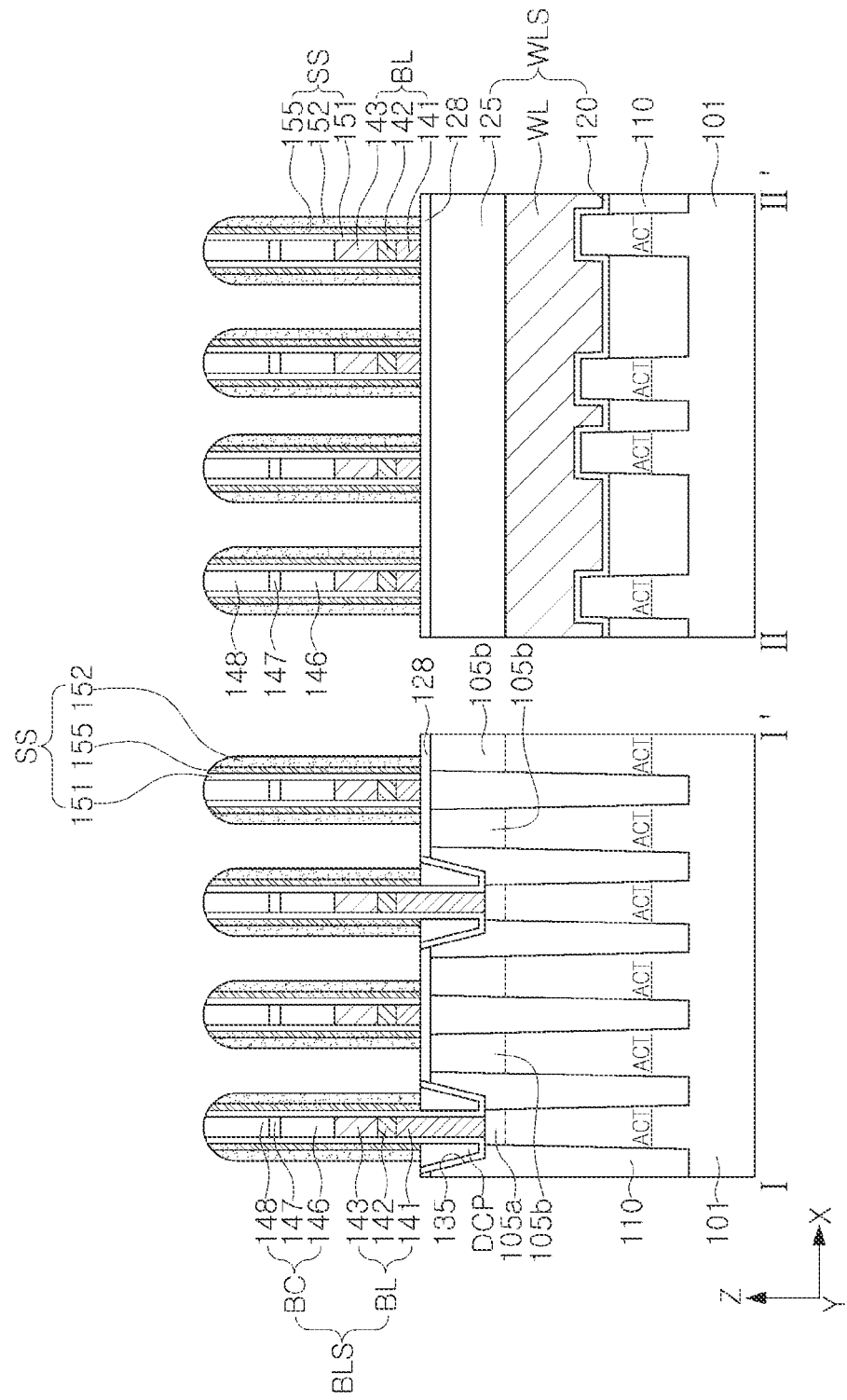
Figure 7C:
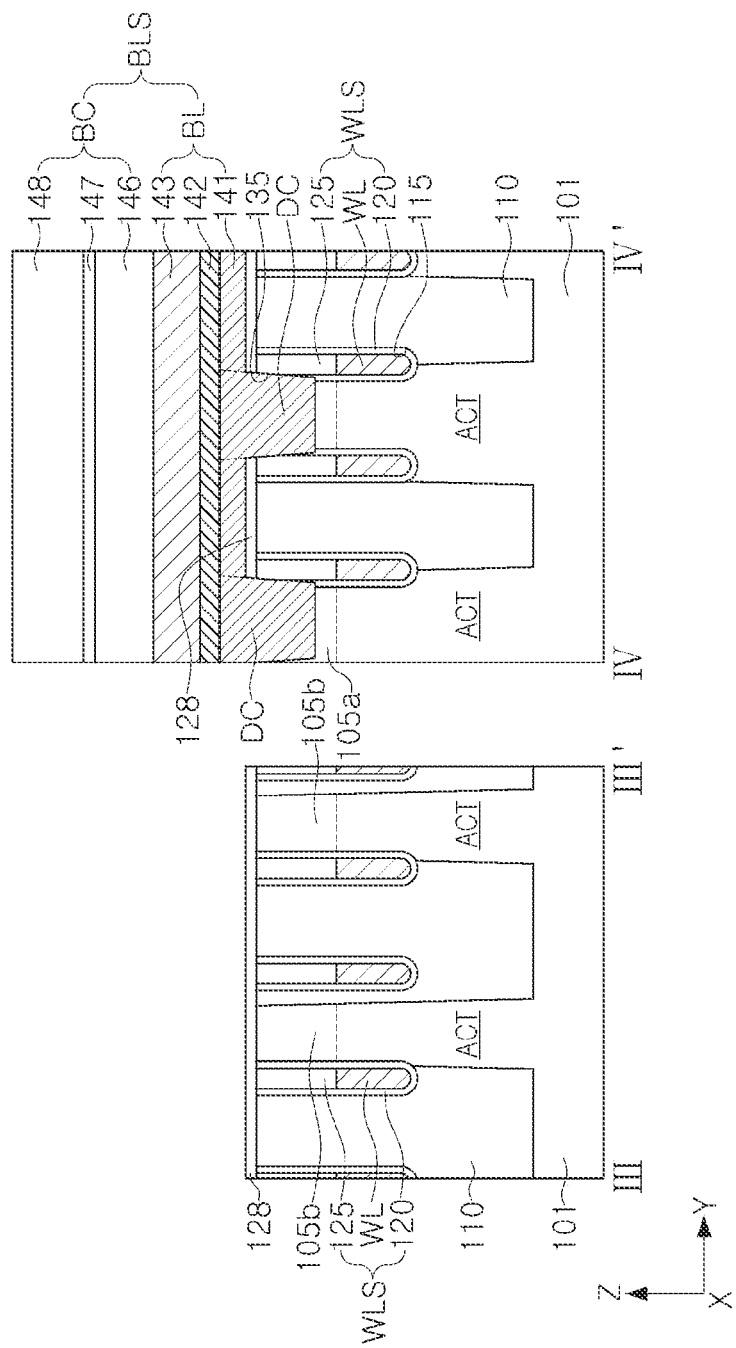

Referring to FIGS. 7A to 7C, a device isolation layer 110 may be formed to define an active region ACT in a substrate 101, wordline structures WLS may be formed in the substrate 101, and bitline structures BLS may be formed on the substrate 101, and spacer structures SS may be formed on opposite sidewalls of the bitline structures BLS.

According to a shallow trench isolation (STI) process, the substrate 101 may be anisotropically etched to form trenches. Insulating materials may be deposited in the trenches, and then a planarization process may be performed to form device isolation layers 110. Before formation of the device isolation layers 110, impurities may be implanted into the substrate 110 to form impurity regions 105a and 105b. According to some embodiments, the impurity regions 105a and 105b may be formed after formation of the device isolation layers 110, or may be formed in another process.

The substrate 101 may be anisotropically etched to form gate trenches 115 in which wordlines WL are arranged. The gate trenches 115 may extend in a first direction (e.g., an X direction), and may intersect the active regions ACT and the device isolation layers 110. In the gate trenches 115, a gate dielectric layer 120, a wordline WL and a buried insulating layer 125 may be sequentially formed. The gate dielectric layer 120 may be formed to have a substantially uniform thickness on internal walls and bottom surfaces of the gate trenches 115. The gate dielectric layer 120 may be formed by an oxidation process of the active region ACT or a deposition process of a dielectric material. The wordlines WL may be formed by depositing a conductive material in the gate trenches 115 and recessing the deposited conductive material to a predetermined depth from above. The buried insulating layer 125 may be formed by depositing an insulating material to fill the remainder of the gate trench 115 and then performing a planarization process. As a result, wordline structures WLS may be formed.

Bitline structures BLS may be formed on the substrate 101. Before formation of the bitline structures BLS, an interlayer insulating layer 128 may be formed on the substrate 101. The interlayer insulating layer 128 may include at least one of, for example, silicon nitride (SiN), silicon oxycarbide (SiOC), silicon oxide (SiO), silicon carbonitride (SiCN), silicon oxynitride (SiON), and silicon oxycabonitride (SiOCN). The bitline structures BLS may be formed by sequentially stacking and patterning layers, constituting a bitline BL and a bitline capping pattern BC, on the substrate 101. The substrate 101 and the interlayer insulating layer 128 may be patterned such that bitline contact holes 135 are formed to expose first impurity regions, respectively, and then a portion of the first conductive pattern 141 constituting the bitline BL may be locally formed in the bitline contact hole 135 to constitute a bitline contact pattern DC.

Spacer structures SS may be formed on opposite sidewalls of the bitline structures BLS. The spacer structures SS may be formed by sequentially forming layers, constituting spacers, and anisotropically etching the spacers. The spacer structures SS may be formed by forming a first spacer 151, a sacrificial spacer 155, and a second sacrificial spacer 152 on opposite sidewalls of the bitlines BL. A portion of the first spacer 151 may extend inwardly of the bitline contact holes 135. While the spacers are formed and anisotropically etched, some of the spacers remain in the bitline contact holes 135 to form a bitline contact spacer DCP. The sacrificial spacer 155 may be formed of an insulating material having etch selectivity with respect to the first spacer 151. For example, the sacrificial spacer 155 may be formed of a silicon oxide. The second spacer 152 may be formed of an insulating material having etch selectivity with respect to the sacrificial spacer 155, the first spacer 151, and the interlayer insulating layer 128. For example, the second spacer 152 may be formed of a silicon nitride or a silicon oxynitride.

In the present operation, active regions and circuit gate electrodes, constituting circuit elements, may be formed in a core region arranged around a memory cell region of a semiconductor device, and gate spacers may be formed on opposite sidewalls of the circuit gate electrodes.

Figure 8A:
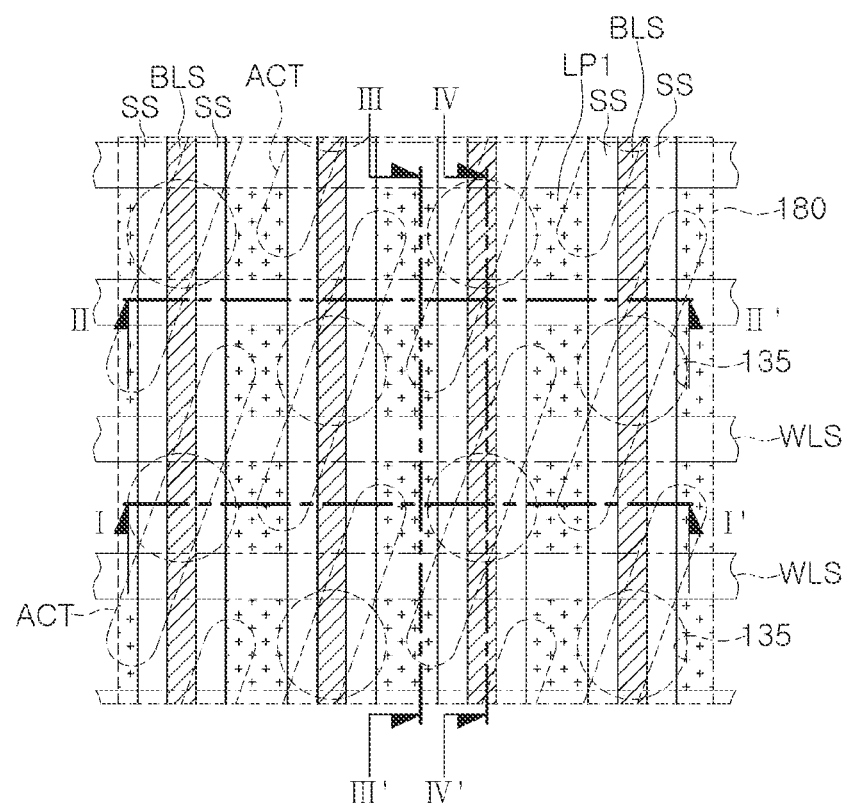
Figure 8B:
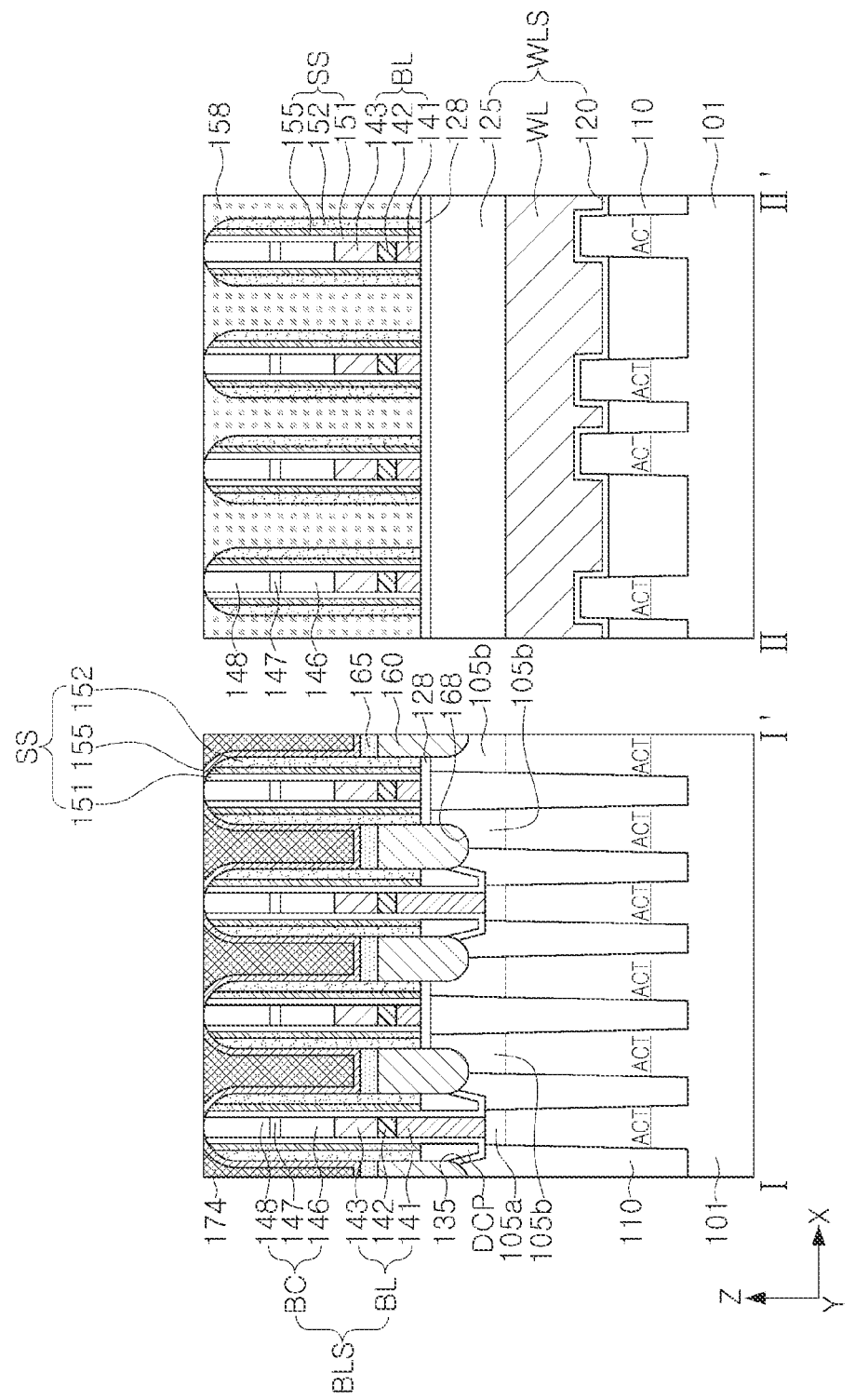
Figure 8C:
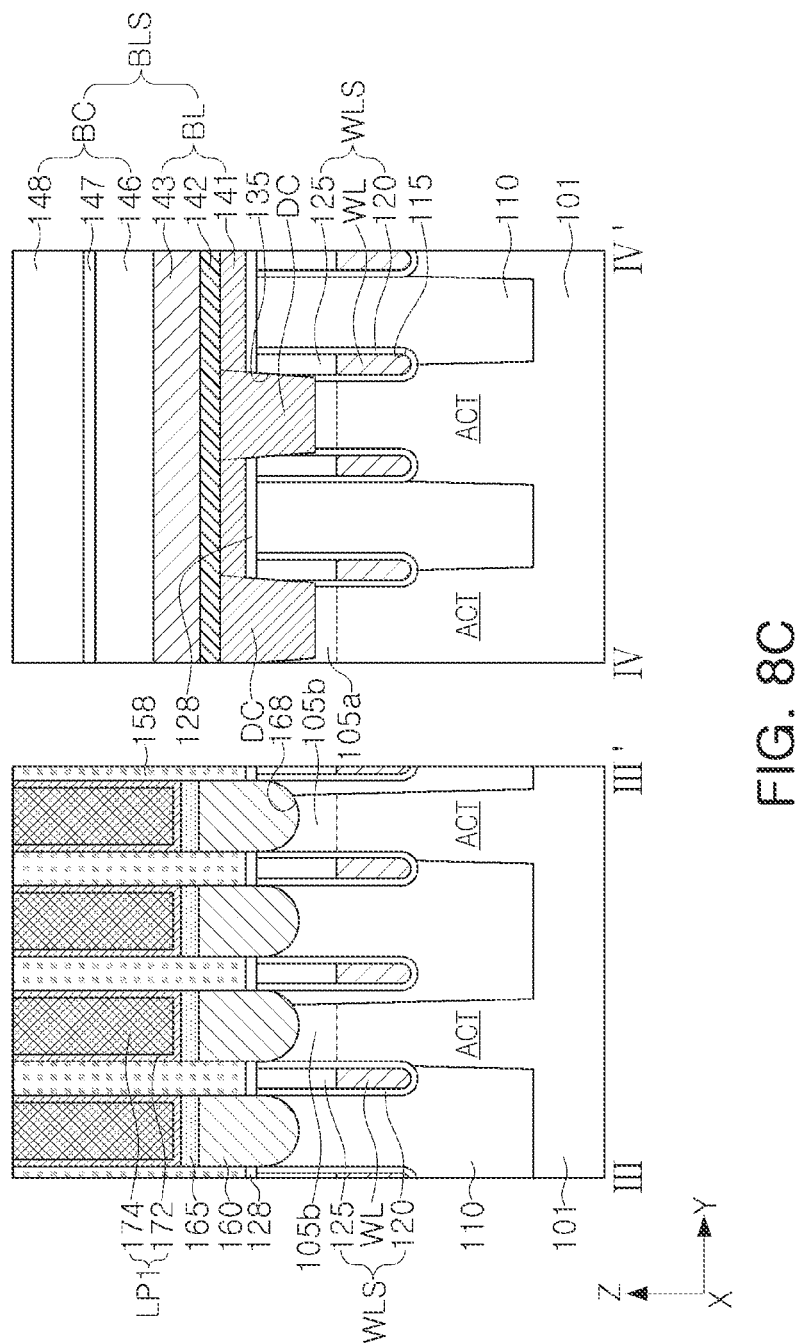

Referring to FIGS. 8A to 8C, insulating patterns 158 may be formed on the interlayer insulating layer 128 between the bitline structures BLS, storage node contacts 160 may be formed to be in contact with the first impurity region 105a through the interlayer insulating layer 128, and a metal-semiconductor layer 165 and a lower landing pad LP1 may be formed on the storage node contact 160.

Sacrificial patterns and insulating patterns 158 may be formed between bitline structures BLS to be alternately arranged in a second direction (e.g., a Y direction), and the sacrificial patterns may be selectively etched with respect to the insulating patterns 158 to be removed. Portions of the interlayer insulating layer 128 and the active region ACT of the substrate 101 may be removed below the sacrificial patterns such that contact openings 168 are formed to expose the second impurity regions 105b, respectively. When the contact openings 168 are formed, a portion of the device isolation layer 110 may be etched and a portion of the bitline contact spacer DCP may be exposed. The sacrificial patterns may be arranged to be spaced apart from each other in the second (Y) direction in a plane, and may be between wordline structures WLS.

Storage node contacts 160 may be formed to fill lower portions of the contact openings 168. The storage node contacts 160 may be formed by depositing a conductive material in contact with the second impurity region 105b in the contact openings 168. The conductive material may include at least one of, for example, a doped semiconductor material, a metal, and a metal nitride. In some example embodiments, the conductive material may include polycrystalline silicon.

A metal-semiconductor layer 165 may be formed on the storage node contacts 160. The metal-semiconductor layer 165 may be formed by reacting upper surfaces of the storage node contacts 160 with a metal material.

Lower landing pads LP1 may be formed to be electrically connected to the storage node contacts 160 while filling upper portions of the contact openings 168, respectively. A first barrier layer 172 may be formed to cover and conform to sidewalls of the contact opening 168 and an upper surface of the metal-semiconductor layer 165, and a first conductive layer 174 may be formed on the first barrier layer 172 to form a lower landing pad LP1. The first barrier layer 172 and the first conductive layer 174 may be formed on a high level than an upper surface of the bitline structure BLS, and then portions of the first barrier layer 172 and the first conductive layer 174 may be removed by a planarization process or an etch-back process to expose the upper surface of the bitline structure BLS.

Figure 9A:
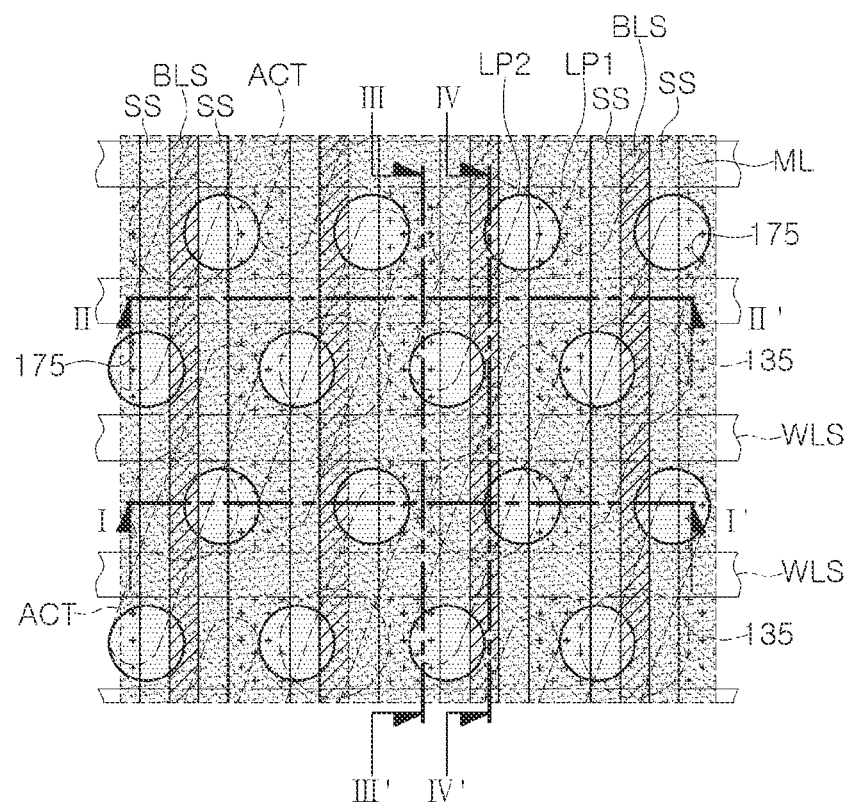
Figure 9B:
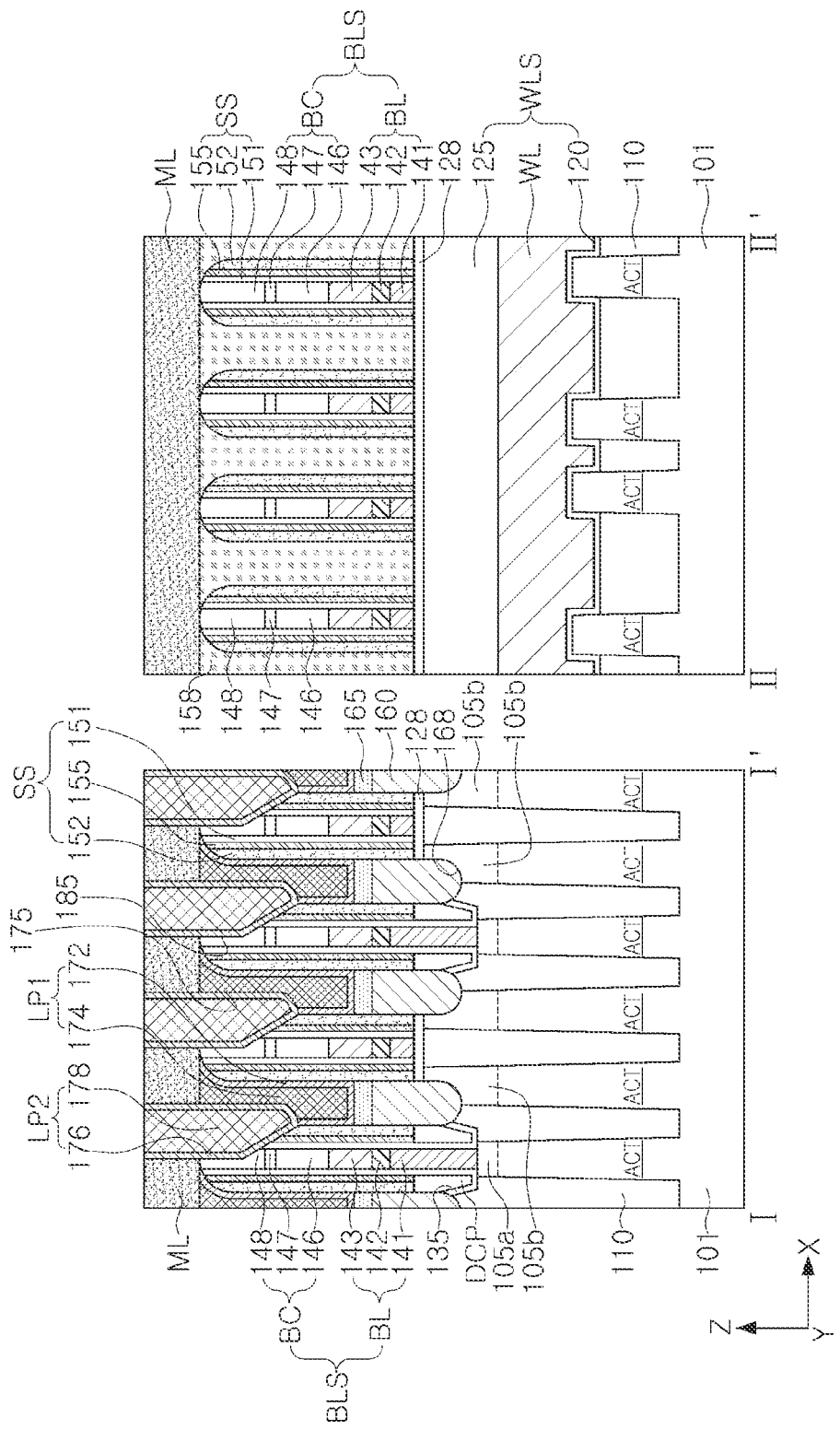
Figure 9C:
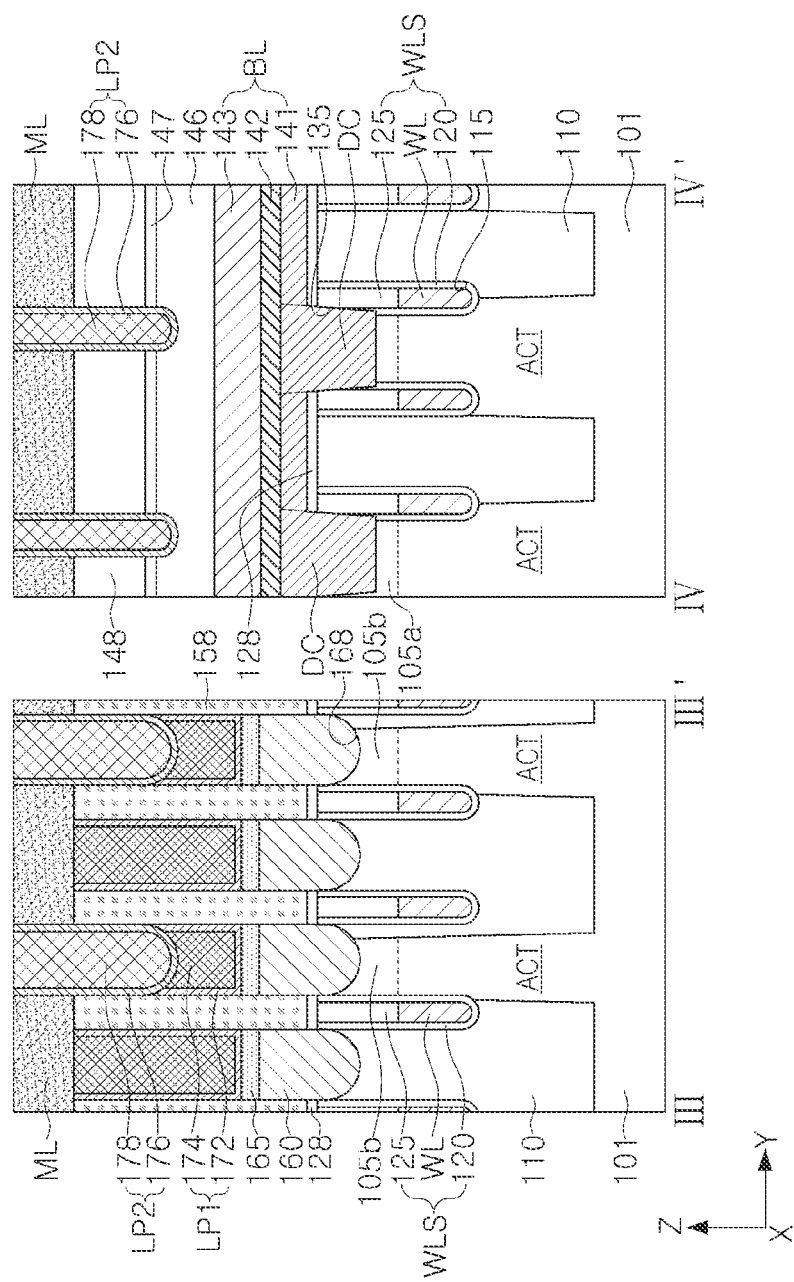

Referring to FIGS. 9A to 9C, a mold sacrificial layer ML may be formed on the bitline structures BLS, and an upper landing pad LP2 may be formed to be connected to the lower landing pad LP1 through the mold sacrificial layer ML.

A mold sacrificial layer ML may be formed to cover the bitline structures BLS, the insulating patterns 158, and the lower landing pads LP1 on the bitline structures BLS. Before formation of the sacrificial mold layer ML, the following processes may be performed by covering a core region that is arranged around a memory cell region of a semiconductor device, with an additional mask layer and exposing only the memory cell region.

As illustrated in FIG. 9A, contact holes 175 may be formed to penetrate through the mold sacrificial layer ML and to be arranged in a grid pattern, forming a hexagonal shape or a honeycomb shape, such that contact holes 175 may be formed to expose the lower landing pads LP1, respectively. The contact holes 175 may be formed in such a manner that a center of each of the contact holes 175 is shifted from a center of the lower landing pads LP1. A portion of the bitline structure BLS and a portion of the spacer structure SS may also be exposed through the contact holes 175. The sacrificial mold layer ML may be formed of a material having an etching selectivity with respect to a nitride and a metal material. The mold sacrificial layer ML may be formed of, for example, a silicon oxide and may be formed by performing a chemical vapor deposition (CVD) process.

A bottom surface of the contact hole 175 may have a slope. For example, the bottom surface of the contact hole 175 may have an oblique slope downward toward a portion in contact with the lower landing pad LP1 from a portion in contact with the bitline capping pattern BC of the bitline structure BLS. The bottom surface of the contact hole 175 may include at least one of a portion having a slope and a curved portion. In the present operation, various example embodiments of FIGS. 1 to 6C may be provided depending on a shape of the bottom surface of the contact hole 175. A lower end of the bottom surface of the contact hole 175, in contact with the lower landing pad LP1, may be arranged on a level lower than a lower end of the bottom surface of the contact hole 175 in contact with the bitline capping pattern BC.

In the contact holes 175, a second barrier layer 176 may be formed to cover and conform to the sidewalls and the bottom surface of the contact hole 175, and the second conductive layer 178 may be formed on a second barrier layer to form an upper landing pad LP2. The second barrier layer 176 and the second conductive layer 178 may be formed on a level higher than the upper surface of the mold sacrificial layer ML, and then portions of the second barrier layer 176 and the second conductive layer 178 may be removed by a planarization process to expose the upper surface of the mold sacrificial layer ML.

Figure 10A:
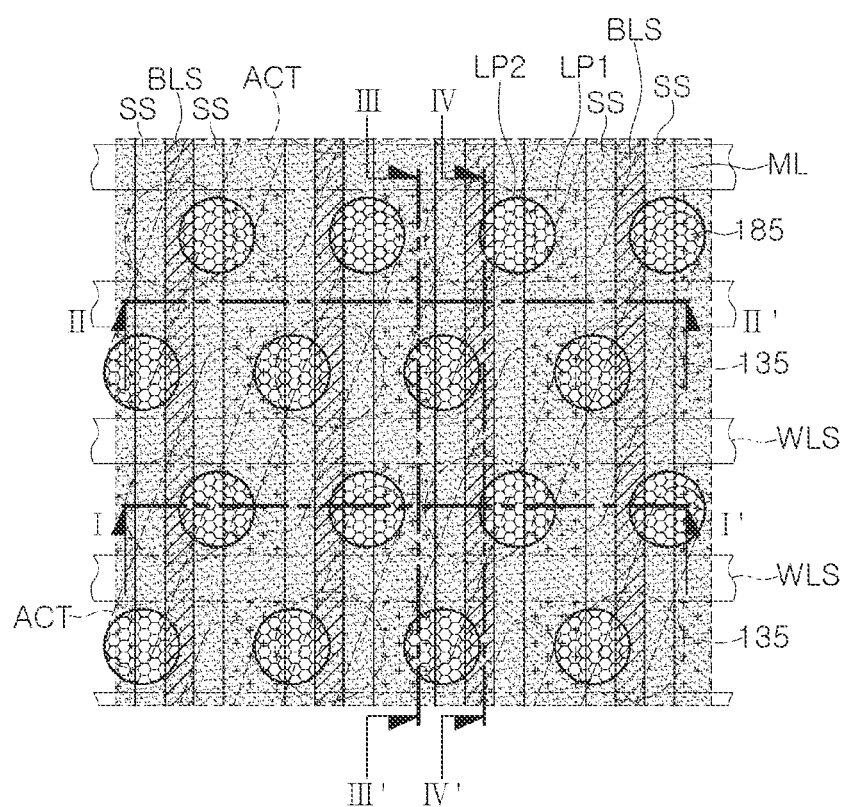
Figure 10B:
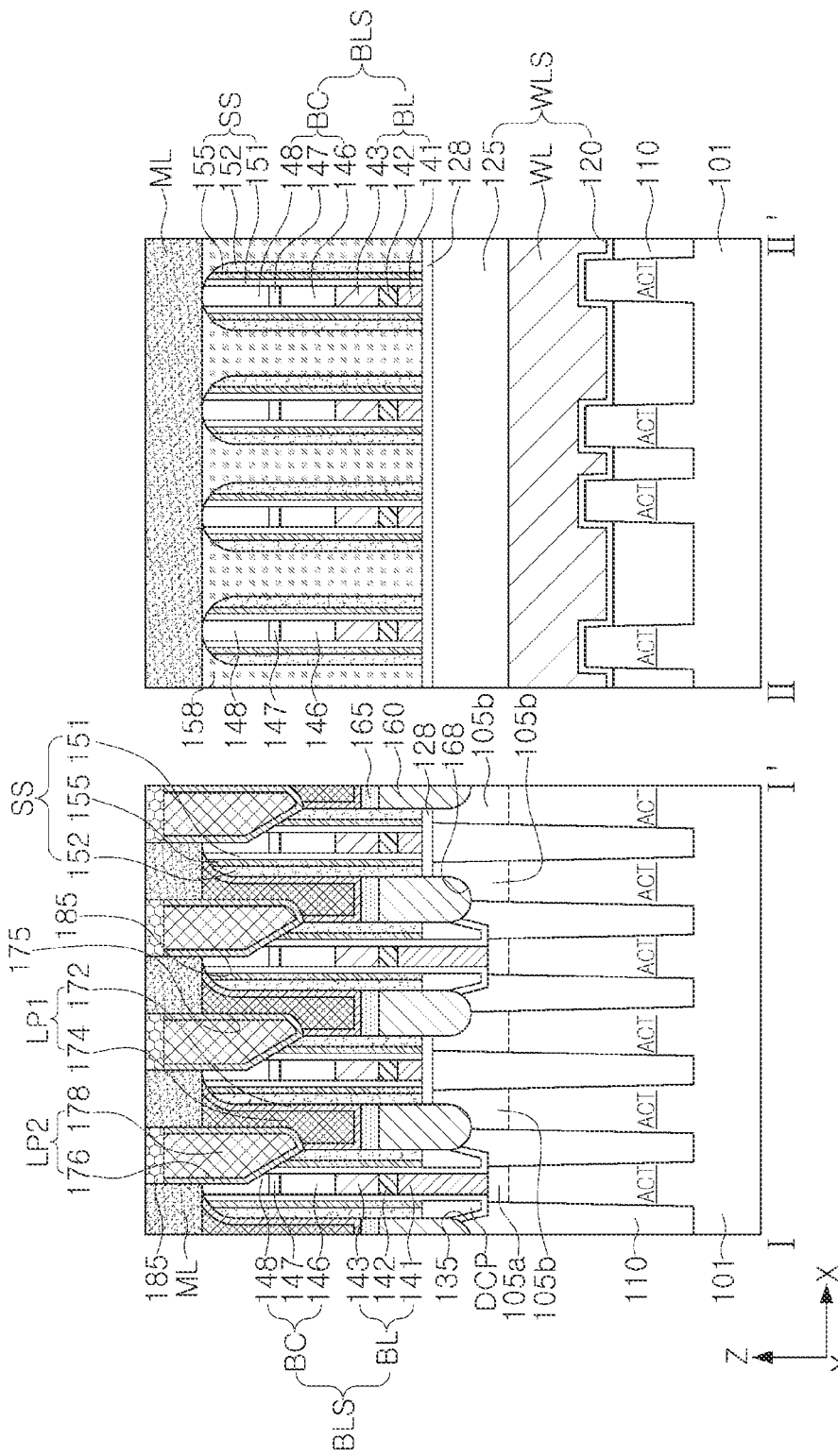
Figure 10C:
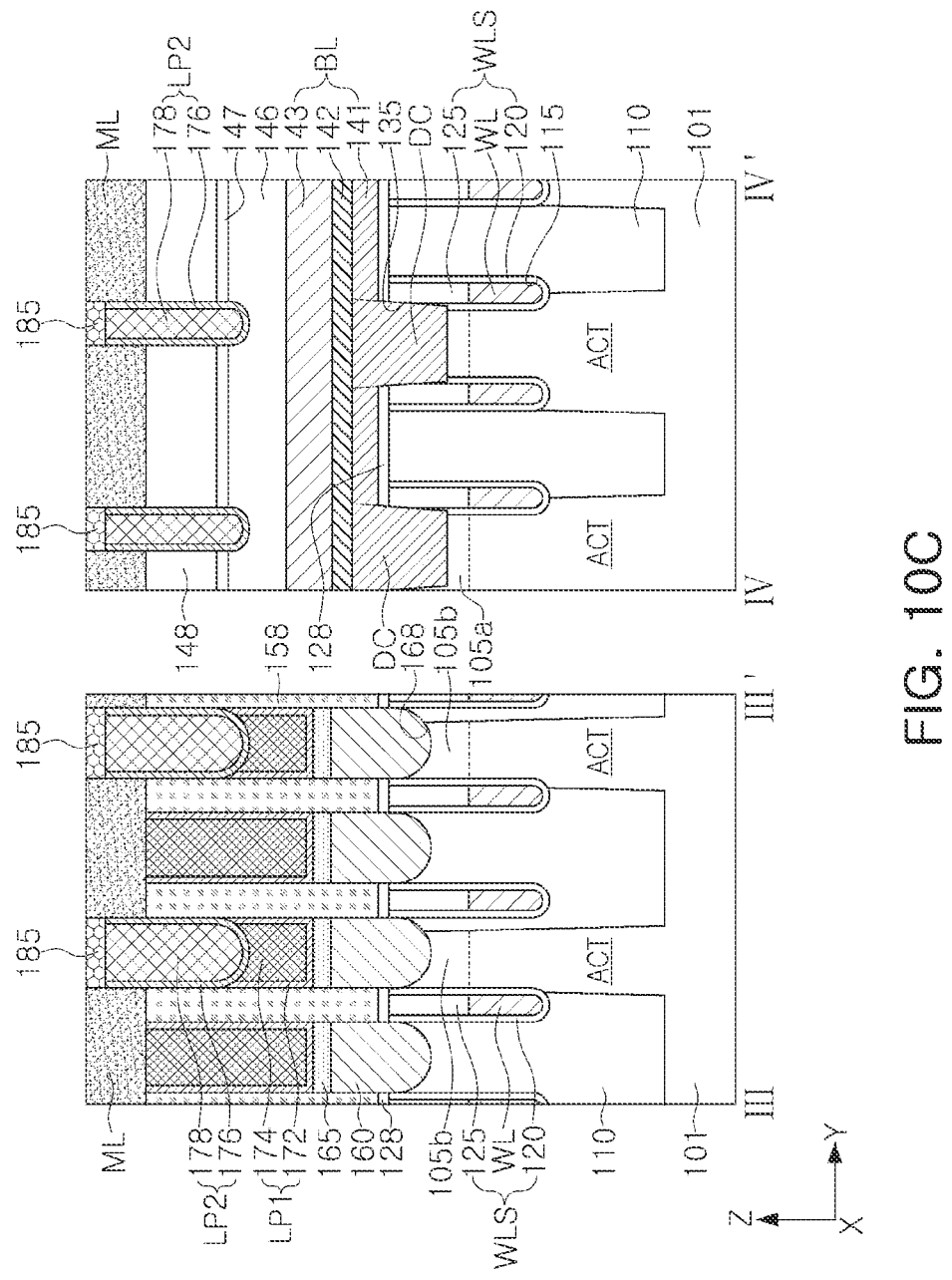

Referring to FIGS. 10A to 10C, a portion of the upper landing pad LP2 may be removed from above, and a mask pattern 185 may be formed on a region in which the upper landing pad LP2 is removed.

A portion of the upper landing pad LP2 may be removed to a predetermined depth from an upper portion of the upper landing pad LP2 using an etch-back process. A mask pattern 185 may be formed by depositing a material, having etch selectivity with respect to a nitride and a metal material, on the region in which the upper landing pad LP2 is removed. The mask pattern 185 may be formed of a semiconductor material such as polycrystalline silicon or an insulating material such as a silicon oxide, a silicon nitride, and a silicon oxynitride.

Figure 11A:
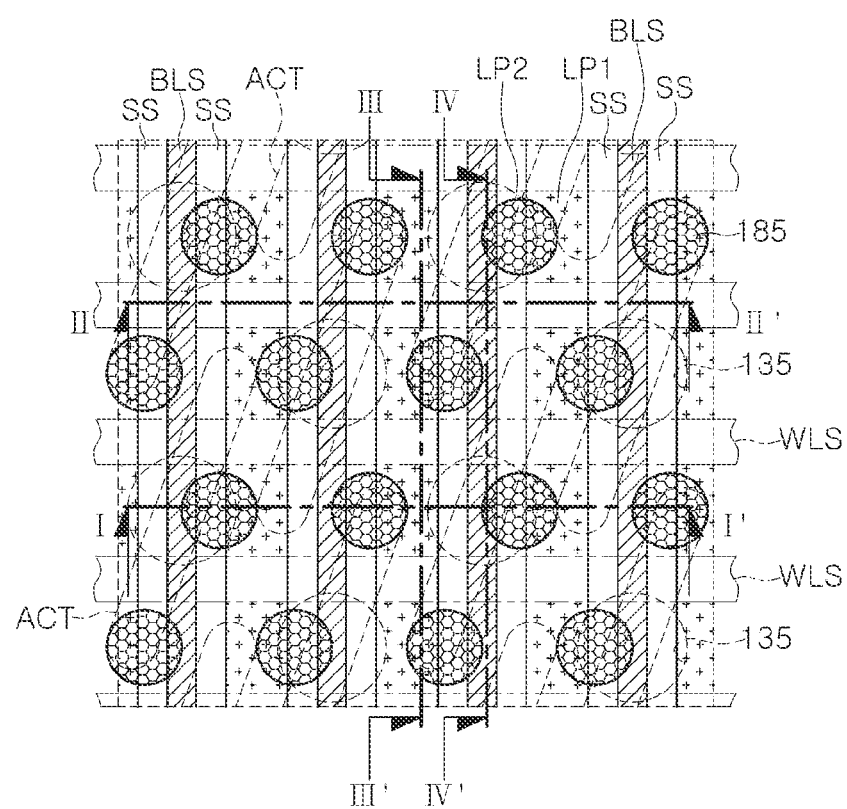
Figure 11B:
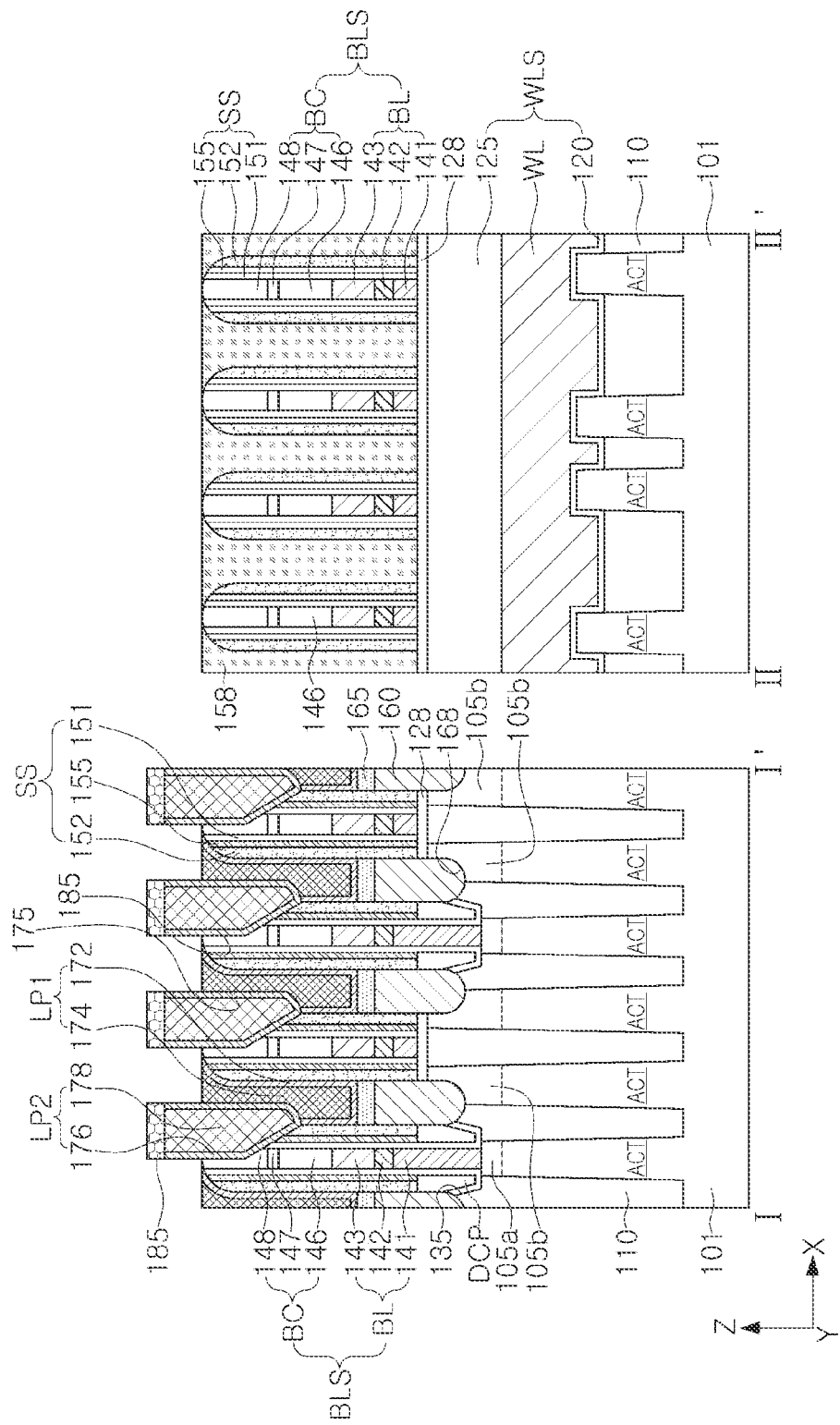
Figure 11C:
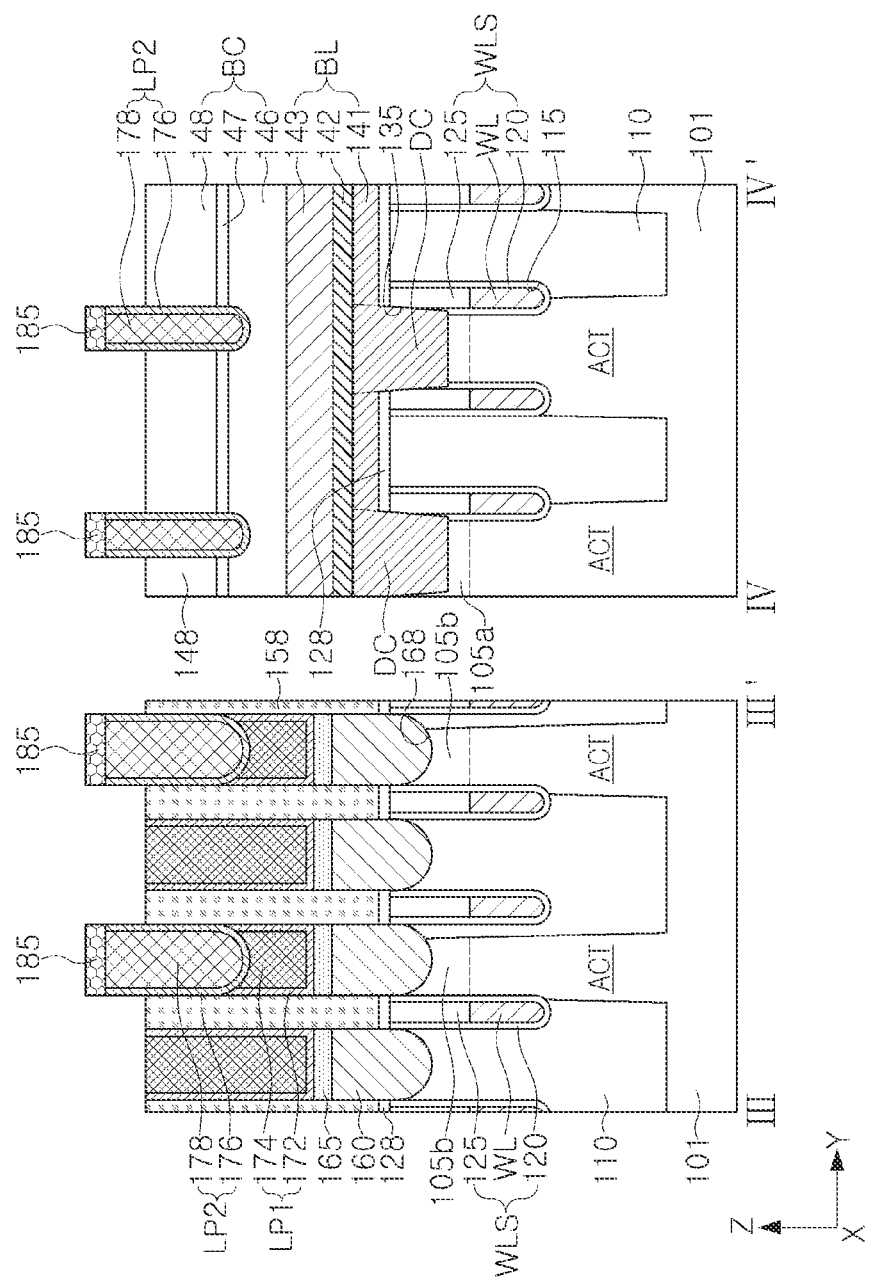

Referring to FIGS. 11A to 11B, the sacrificial mold layer ML may be removed.

The mold sacrificial layer ML may be selectively removed with respect to the mask pattern 185, the upper landing pad LP2, the lower landing pad LP1, the insulating patterns 158, the bitline capping pattern BC, and the spacer structure SS. The sacrificial mold layer ML may be removed by performing, for example, a wet etching process.

Figure 12A:
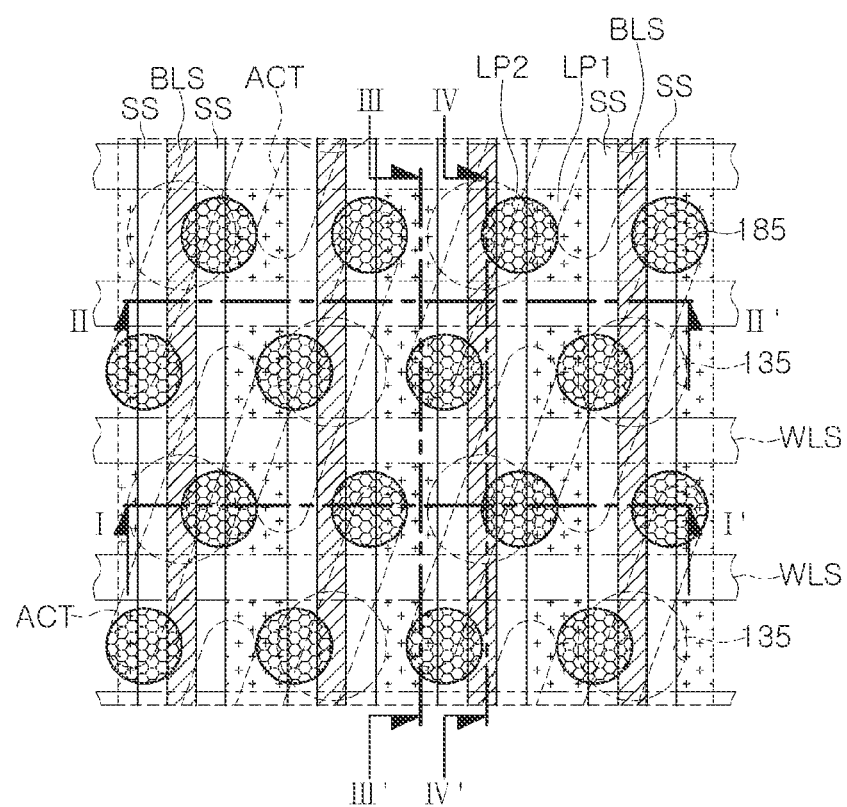
Figure 12B:
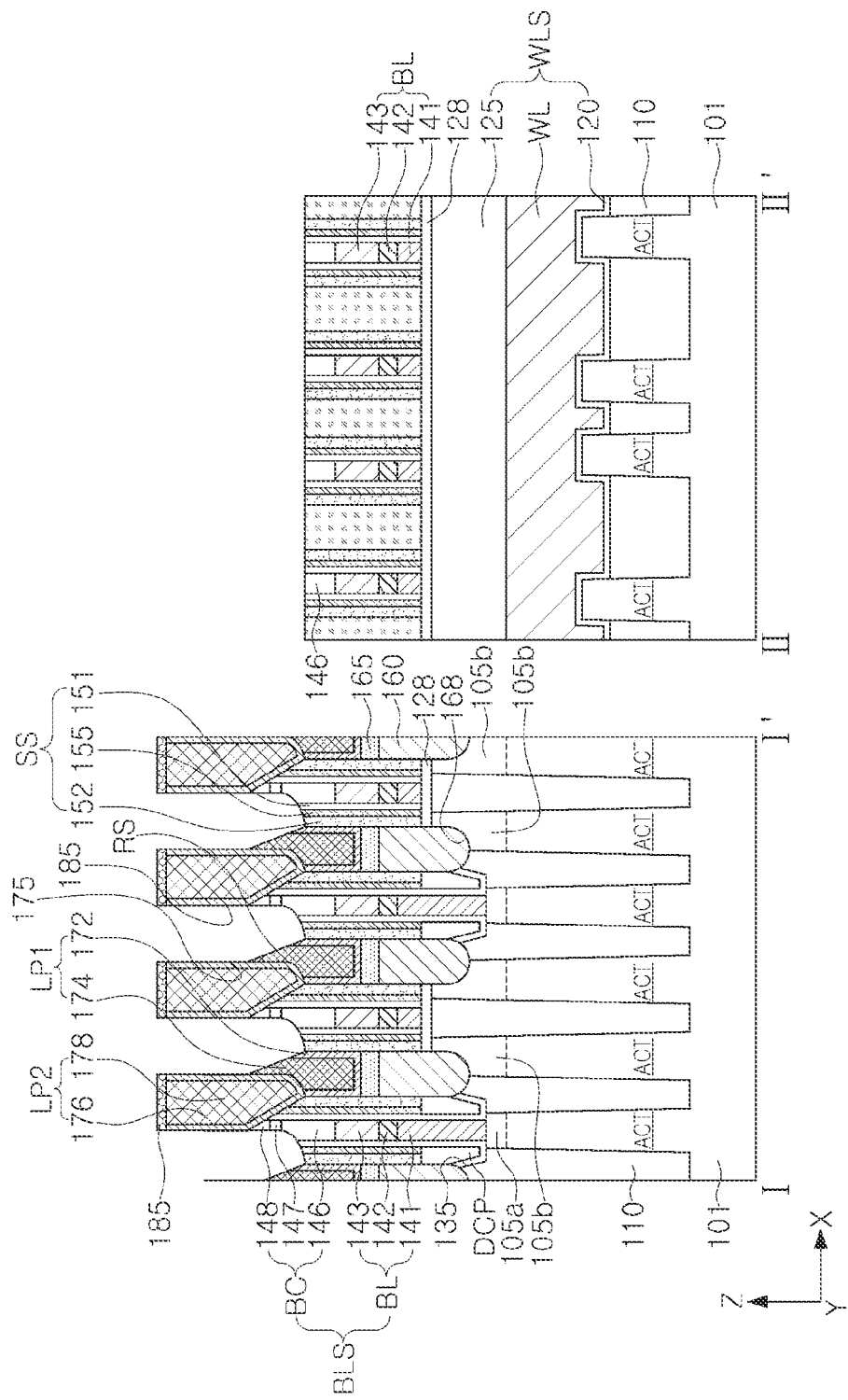
Figure 12C:
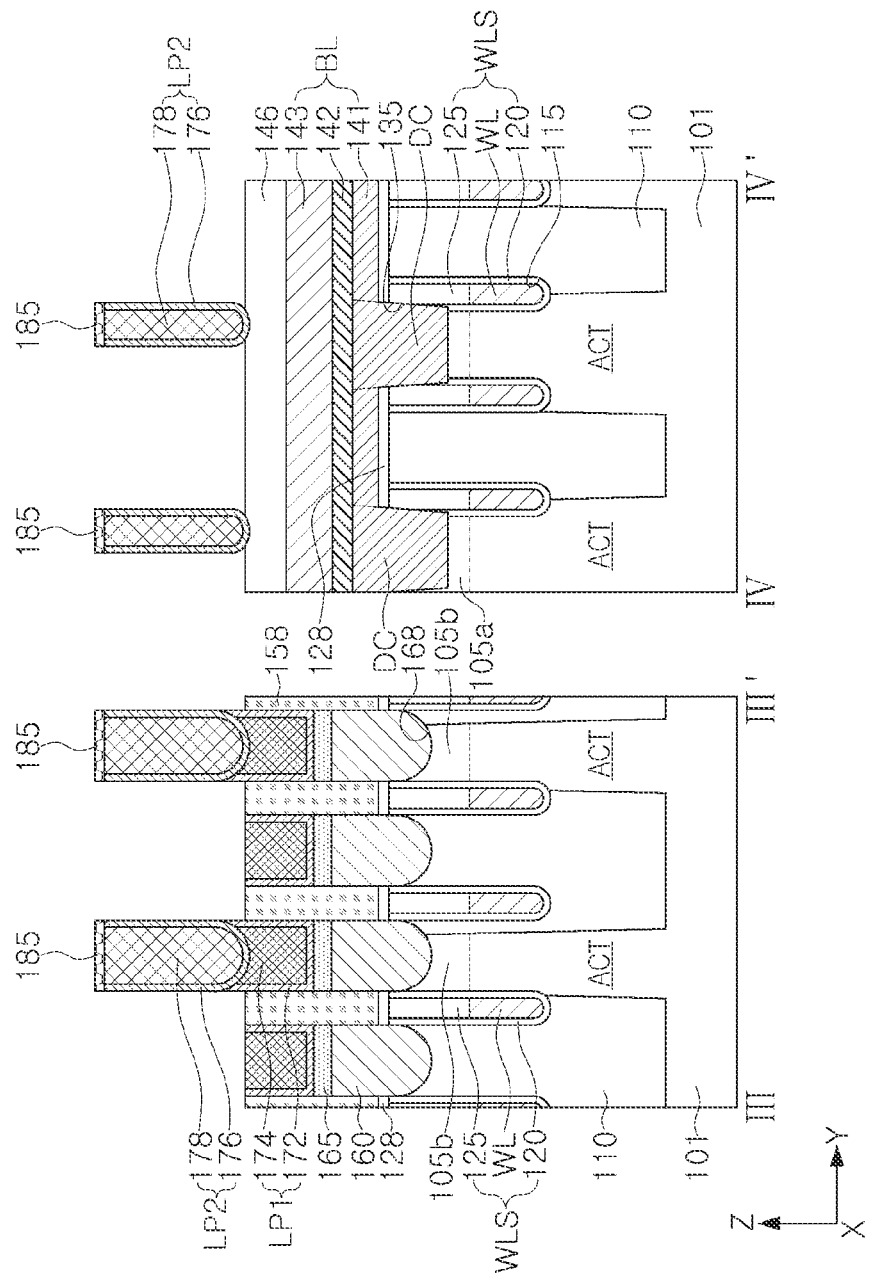

Referring to FIGS. 12A to 12C, an etching process may be performed using the upper landing pad LP2 and the mask pattern 185 as etching masks.

An etching process may be performed in a region, in which the upper landing pad LP2 is not present or arranged, to remove a portion of each of the lower landing pad LP1, the bitline capping pattern BC, the spacer structure SS, and the insulating patterns 158. The etching process using the upper landing pad LP2 and the mask pattern 185 as etching masks may be a positive etching process. Accordingly, recess regions RS corresponding to a location, in which the capping insulating layer 180 is formed, may be formed between the upper landing pads LP2. The recess regions RS may have a first lower end in contact with the lower landing pad LP1 and a second lower end in contact with the spacer structure SS between the upper landing pads LP2, and the second lower end may be arranged on a level lower than the first lower end. In addition, a bottom surface of each of the recess regions RS may have a slope. For example, the bottom surface of each of the recess regions RS may have an oblique slope downward toward a portion in contact with the spacer structure SS from a portion in contact with the lower landing pad LP1 between the upper landing pads LP2. The bottom surface of each of the recess regions RS may include at least one of a portion having a slope and a curved portion. In the present operation, various example embodiments of FIGS. 1 to 6C may be provided depending on a shape of the bottom surface of each of the recess regions RS. The recess regions RS may be self-aligned between the upper landing pads LP2. In the present operation, a thickness of the mask pattern 185 may be decreased, or the mask pattern 185 may be completely removed.

In the present operation, the sacrificial spacer 155 may be exposed by the recess regions RS. After removal of the sacrificial spacer 155, a space between upper ends of the first and second spacers 151 and 152 may be capped with the capping insulating layer to form an air spacer 156.

Figure 13A:
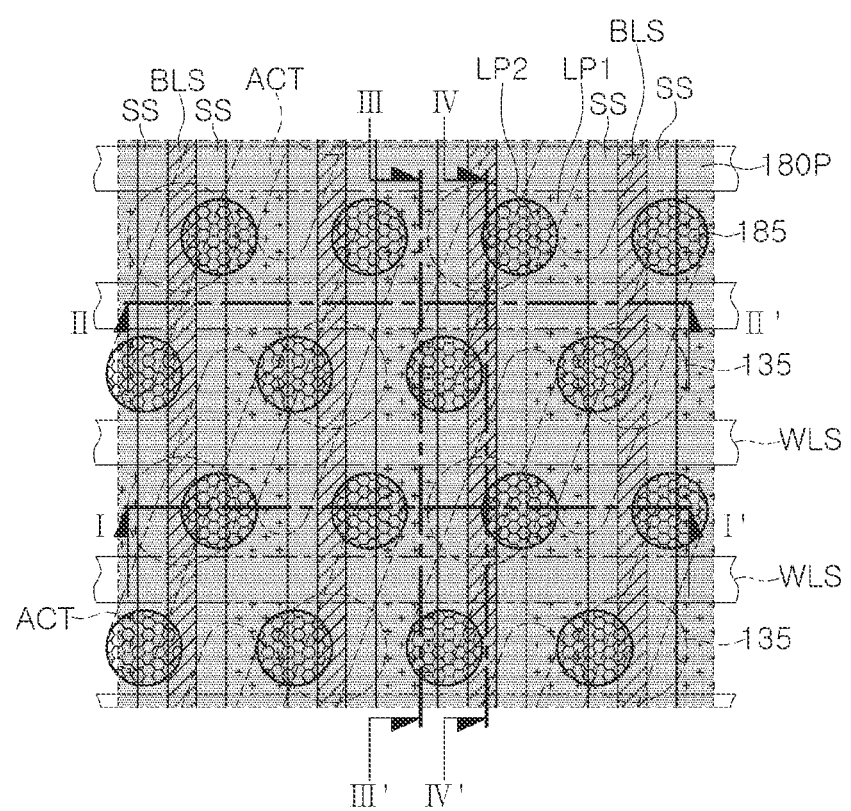
Figure 13B:
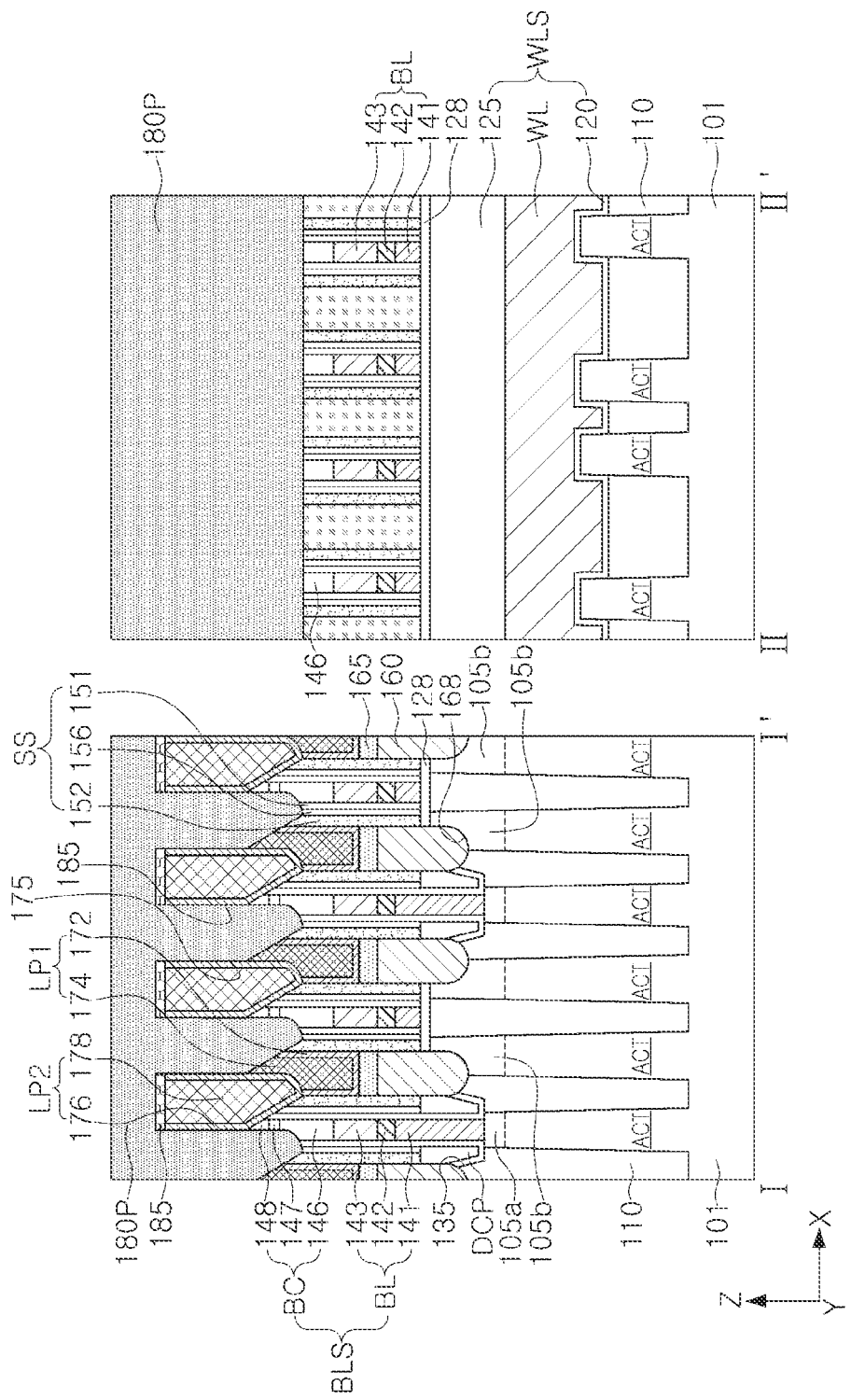
Figure 13C:
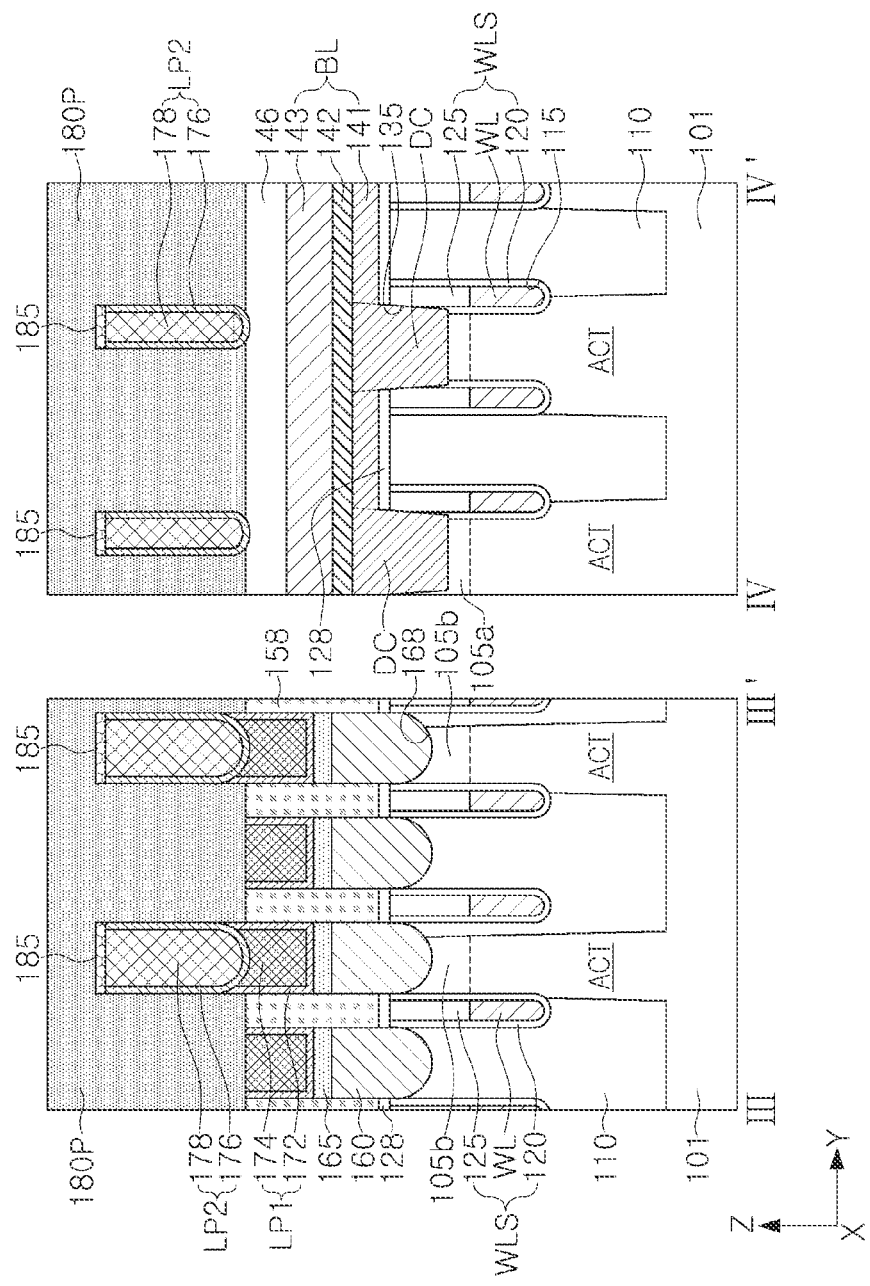

Referring to FIGS. 13A to 13C, a preliminary capping insulating layer 180P may be formed on the bitline structures BLS to fill a space between the upper landing pads LP2.

The preliminary capping insulating layer 180P may extend between the upper landing pads LP2, and may be formed to cover a bottom surface of each of the recess regions RS. In addition, the preliminary capping insulating layer 180P may be formed to have a bottom surface corresponding to the bottom surface of each of the recess regions RS between the upper landing pads LP2.

Referring to FIGS. 1 to 3 together, a portion of the preliminary capping insulating layer 180P may be removed by performing a planarization process and/or an etch-back process to form the capping insulating layer 180 and to remove the mask pattern 185. Then, a capacitor structure CAP may be formed on the upper landing pad LP2. As a result, the semiconductor device 100 of FIGS. 1 to 3 may be manufactured.

Figure 14:
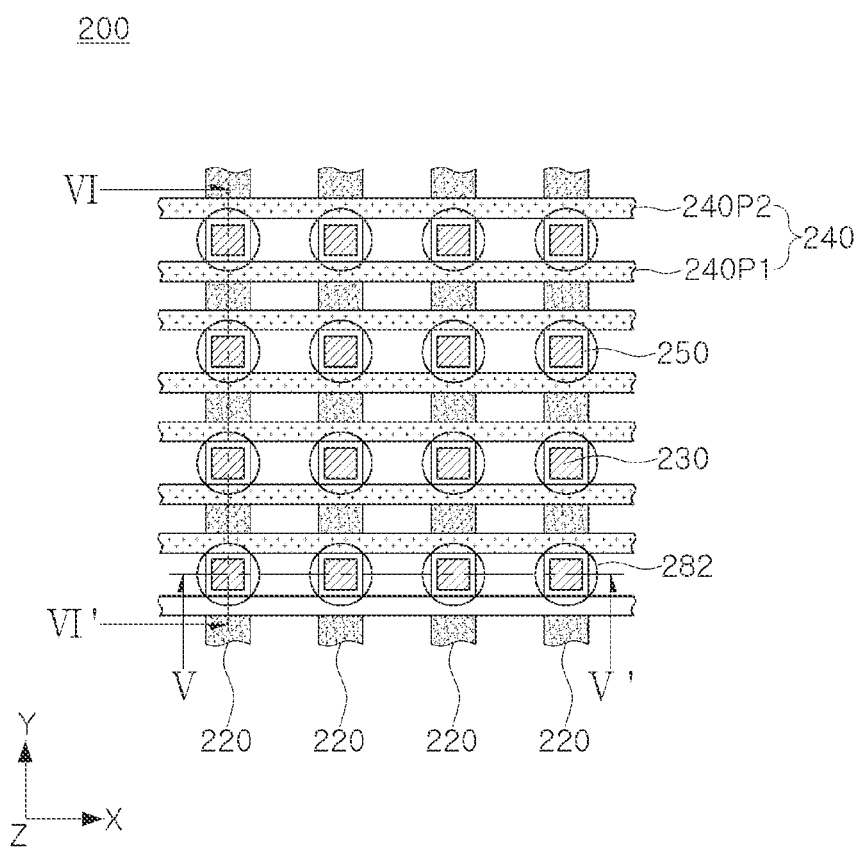
FIG. 14 is a schematic layout diagram of a semiconductor device according to some example embodiments.
Figure 15:
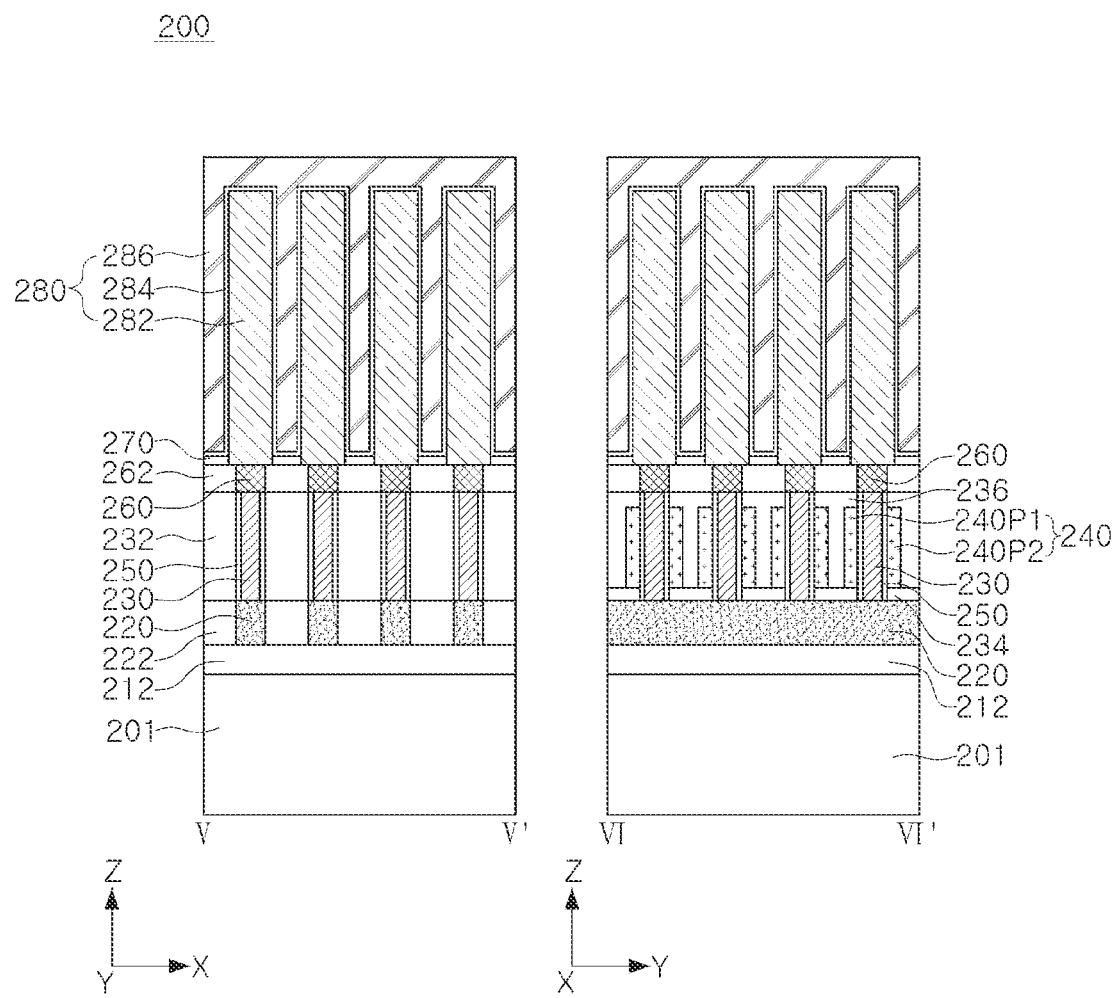
FIG. 15 is a schematic cross-sectional view of a semiconductor device according to some example embodiments.

FIG. 14 is a schematic layout diagram of a semiconductor device according to some example embodiments. FIG. 15 is a schematic cross-sectional view of a semiconductor device according to some example embodiments. FIG. 15 illustrates cross-sections, respectively taken along lines V-V' and VI-VI' of FIG. 14.

Referring to FIGS. 14 and 15, a semiconductor device 200 may include a substrate 201, a plurality of first conductive lines 220, a channel layer 230, a gate electrode 240, a gate insulating layer 250, and a capacitor structure 280. The semiconductor device 200 may be a memory device including a vertical channel transistor (VCT). The vertical channel transistor may refer to a structure in which a channel length of the channel layer 230 is increased from the substrate 201 in a vertical direction.

A lower insulating layer 212 may be arranged on the substrate 201, and the plurality of first conductive lines 220 may be spaced apart from each other in a first direction (e.g., an X direction) and may extend in a second direction (e.g., a Y direction) on the lower insulating layer 212. A plurality of first insulating patterns 222 may be arranged on the lower insulating layer 212 to fill a space between the plurality of first conductive lines 220. The plurality of first insulating patterns 222 may extend in the second (Y) direction, and upper surfaces of the plurality of first insulating patterns 222 may be arranged on the same level as the upper surfaces of the plurality of first conductive lines 220. The plurality of first conductive lines 220 may function as bitlines of the semiconductor device 200.

In some example embodiments, the plurality of first conductive lines 220 may include doped polysilicon, a metal, a conductive metal nitride, a conductive metal silicide, a conductive metal oxide, or combinations thereof. For example, the plurality of first conductive lines 220 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the present disclosure is not limited thereto. The plurality of first conductive lines 220 may have a single-layer structure or a multi-layer structure including the above-mentioned materials. In some example embodiments, the plurality of first conductive lines 220 may include a two-dimensional (2D) semiconductor material. For example, the 2D semiconductor material may be graphene, carbon nanotubes, or a combination thereof.

The channel layers 230 may be spaced apart from each other in the X and Y directions to be arranged in a matrix on the plurality of first conductive lines 220. The channel layer 230 may have a first width in the X direction and a first height in a Z direction, and the first height may be greater than the first width. For example, the first height may be about two to ten times the first width, but the present disclosure is not limited thereto. A bottom portion of the channel layer 230 may function as a first source/drain region, not illustrated, an upper portion of the channel layer 230 may function as a second source/drain region, not illustrated, and a portion of the channel layer 230 between the first and second source/drain regions may function as a channel region, not illustrated.

In some example embodiments, the channel layer 230 may include an oxide semiconductor. For example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO_a$, $Al_xZn_ySn_zO$, $Yb_xGa_yZn_zO$, $In_xGa_yO$, or combinations thereof. The channel layer 230 may have a single-layer structure or a multilayer structure including the oxide semiconductor. In some examples, the channel layer 230 may have greater band gap energy than silicon. For example, the channel layer 230 may have band gap energy of about 1.5 eV to 5.6 eV. For example, when the channel layer 230 has band gap energy of about 2.0 eV to 4.0 eV, the channel layer 230 may have optimal channel performance. For example, the channel layer 230 may be polycrystalline or amorphous, but the present disclosure is not limited thereto. In some example embodiments, the channel layer 230 may include a two-dimensional (2D) semiconductor material. For example, the 2D semiconductor material may include graphene, carbon nanotubes, or a combination thereof.

The gate electrode 240 may extend in the first (X) direction on opposite sidewalls of the channel layer 230. The gate electrode 240 may include a first sub-gate electrode 240P1, facing a first sidewall of the channel layer 230, and a second sub-gate electrode 240P2 facing a second sidewall opposing the first sidewall of the channel layer 230. As a single channel layer 230 is arranged between the first sub-gate electrode 240P1 and the second sub-gate electrode 240P2, the semiconductor device 200 may have a dual-gate transistor structure. However, the present disclosure is not limited thereto, and the second sub-gate electrode 240P2 is optional and may be omitted, and only the first sub-gate electrode 240P1, facing the first sidewall of the channel layer 230, may be formed to implement a single-gate transistor structure.

The gate electrode 240 may include doped polysilicon, a metal, a conductive metal nitride, a conductive metal silicide, a conductive metal oxide, or combinations thereof. For example, the gate electrode 240 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof, but the present disclosure is not limited thereto.

The gate insulating layer 250 may surround the sidewall of the channel layer 230, and may be interposed between the channel layer 230 and the gate electrode 240. For example, as illustrated in FIG. 14, the entire sidewall of the channel layer 230 may be surrounded by the gate insulating layer 250, and a portion of the sidewall of the gate electrode 240 may be in contact with the gate insulating layer 250. In other example embodiments, the gate insulating layer 250 may extend in the direction in which the gate electrode 240 extends (for example, the first (X) direction) and, among the sidewalls of the channel layer 230, only two sidewalls facing the gate electrode 240 may be in contact with the gate insulating layer 250.

In some example embodiments, the gate insulating layer 250 may include a silicon oxide layer, a silicon oxynitride layer, a high-k dielectric layer having a higher dielectric constant than the silicon oxide layer, or combinations thereof. The high-k dielectric layer may include a metal oxide or a metal oxynitride. A high-k dielectric layer, able to be used as the gate insulating layer 250, may include, for example, $HfO_2$, HfSiO, HfSiON, HfTaO, HfTiO, HfZrO, $ZrO_2$, $Al_2O_3$, or combinations thereof, but the present disclosure is not limited thereto.

A plurality of second insulating patterns 232 may extend in the second (Y) direction on the plurality of first insulating patterns 222, and the channel layer 230 may be arranged between two adjacent second insulating patterns 232, among the plurality of second insulating patterns 232. In addition, a first buried layer 234 and a second buried layer 236 may be arranged in a space between two adjacent channel layers 230, between two adjacent second insulating patterns 232. The first buried layer 234 may be in a bottom portion of a space between two adjacent channel layers 230, and the second buried layer 236 may be formed to fill the remainder of the space between the two adjacent channel layers 230 on the first buried layer 234. An upper surface of the second buried layer 236 may be on the same level as an upper surface of the channel layer 230, and the second buried layer 236 may cover an upper surface of the gate electrode 240. Alternatively, the plurality of second insulating patterns 232 may be formed as a material layer continuous with the plurality of first insulating patterns 222, or the second buried layer 236 may be formed as a material layer continuous with the first buried layer 234.

A capacitor contact 260 may be disposed on the channel layer 230. The capacitor contact 260 may be disposed to vertically overlap the channel layer 230. Capacitor contacts 260 may be spaced apart from each other in the first (X) direction and the second (Y) direction to be arranged in a matrix. The capacitor contact 260 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the present disclosure is not limited thereto. The upper insulating layer 262 may surround sidewalls of the capacitor contact 260 on the plurality of second insulating patterns 232 and the second buried layer 236.

An etch-stop layer 270 may be on the upper insulating layer 262, and a capacitor structure 280 may be disposed on the etch-stop layer 270. The capacitor structure 280 may include a lower electrode 282, a capacitor dielectric layer 284, and an upper electrode 286.

The lower electrode 282 may penetrate through the etch-stop layer 270 to be electrically connected to an upper surface of the capacitor contact 260. The lower electrode 282 may be formed in the form of a pillar extending in a third (Z) direction, which may be a vertical direction, but the present disclosure is not limited thereto. In some example embodiments, the lower electrode 282 may be arranged to vertically overlap the capacitor contact 260 and may be spaced apart from each other in the first (X) and second (Y) directions to be arranged in a matrix form. Alternatively, a landing pad structure (see LP of FIG. 2A) may be further provided between the capacitor contact 260 and the lower electrode 282, so that the lower electrode 282 may be arranged in a grid pattern forming a hexagonal shape or a honeycomb shape. In this case, by the method described above with reference to FIGS. 4 and 9A to 13, an upper landing pad (see LP2 of FIG. 4) may be formed using a negative etching process, and a capping insulating layer (see 180 of FIG. 4) may be formed by performing a positive etching process using an upper landing pad (or the mask pattern 185 of FIG. 12B) masks.

As described above, a placement and a shape of a landing pad structure may be optimized to provide a semiconductor device having improved electronic characteristics and reliability.

While some example embodiments have been shown and described above, it will be apparent to those skilled in the art that modifications and variations could be made without departing from the scope of the present inventive concepts as defined by the appended claims.

What is claimed is:

1. A semiconductor device comprising:
   a substrate including a first active region and a second active region;
   a bitline structure that extends in one direction on the substrate and electrically connected to the first active region;
   a storage node contact on a sidewall of the bitline structure and electrically connected to the second active region;
   a spacer structure between the bitline structure and the storage node contact;
   a lower landing pad on the storage node contact and in contact with a sidewall of the spacer structure;
   an upper landing pad on the bitline structure, the spacer structure, and the lower landing pad and electrically connected to the lower landing pad, the upper landing pad having first and second sidewalls that oppose each other;
   a capping insulating layer on the lower landing pad having a sidewall and in contact with the second sidewall of the upper landing pad; and
   a capacitor structure on the capping insulating layer and electrically connected to the upper landing pad,
   wherein the upper landing pad includes a first region that overlaps the bitline structure in a vertical direction and a second region that overlaps the lower landing pad in the vertical direction,
   wherein a lower end of the second region of the upper landing pad is closer to the substrate than a lower end of the first region of the upper landing pad, and
   wherein a lower surface of the capping insulating layer includes a first portion in which a horizontal separation distance is increased from the upper landing pad in a downward direction.

2. The semiconductor device of claim 1,
   wherein the first and second regions of the upper landing pad include the first and second sidewalls, respectively, and
   wherein a lower surface of the upper landing pad that connects lowermost points of the first and second sidewalls to each other includes a first portion in which a vertical depth of the upper landing pad is increased in a direction toward the lower landing pad.

3. The semiconductor device of claim 2, wherein the first portion of the lower surface of the upper landing pad includes at least one sloped portion and/or curved portion, wherein the first portion is in contact with the bitline structure, and wherein the first portion is connected to the first sidewall of the upper landing pad.

4. The semiconductor device of claim 2, wherein the lower surface of the upper landing pad further includes a second portion in contact with the lower landing pad.

5. The semiconductor device of claim 4, wherein the second portion of the lower surface of the upper landing pad includes at least one sloped portion and/or curved portion, and wherein the second portion is connected to the second sidewall of the upper landing pad.

6. The semiconductor device of claim 1, wherein each of the lower landing pad and the upper landing pad includes at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

7. The semiconductor device of claim 1, wherein the first portion of the lower surface of the capping insulating layer is in contact with the lower landing pad.

8. A semiconductor device comprising:
   a substrate including an active region;
   a first bitline structure and a second bitline structure that extend side by side on the substrate;
   a storage node contact electrically connected to the active region between the first and second bitline structures;
   a lower landing pad between the first and second bitline structures and on the storage node contact;
   an upper landing pad in contact with the first bitline structure and electrically connected to the lower landing pad; and
   a capping insulating layer adjacent to and in contact with the second bitline structure, the upper landing pad, and the lower landing pad,
   wherein a lower surface of the upper landing pad in contact with the first bitline structure includes a portion in which a horizontal separation distance is increased from the contacting capping insulating layer in a direction toward the substrate, and
   wherein a lower surface of the capping insulating layer in contact with the lower landing pad includes a portion in which a horizontal separation distance is increased from the contacting upper landing pad in the direction toward the substrate.

9. The semiconductor device of claim 8, wherein a lowermost portion of the upper landing pad is in contact with the lower landing pad.

10. The semiconductor device of claim 8, wherein the portion of the lower surface of the upper landing pad includes at least one of a portion having a slope and a curved portion.

11. The semiconductor device of claim 10, wherein the portion of the lower surface of the upper landing pad is in contact with the first bitline structure.

12. The semiconductor device of claim 8, wherein the portion of the lower surface of the capping insulating layer includes at least one sloped portion and/or curved portion.

13. The semiconductor device of claim 12, wherein the portion of the lower surface of the capping insulating layer is in contact with the lower landing pad.

14. The semiconductor device of claim 8, wherein a lower portion of the upper landing pad has a pointed shape in the direction toward the substrate.

15. The semiconductor device of claim 8, wherein a lower portion of the capping insulating layer has a pointed shape in the direction toward the substrate.

16. A semiconductor device comprising:
- a substrate including at least two first active regions and at least two second active regions;
- at least two bitlines that are spaced apart from each other and that extend side by side on the substrate, each electrically connected to a corresponding one of the at least two first active regions;
- at least two bitline capping patterns, each of the bitline capping patterns on a corresponding bitline;
- spacer structures on sidewalls of the bitlines and sidewalls of the bitline capping patterns;
- at least two storage node contacts between the spacer structures, each storage node contact electrically connected to a corresponding second active region;
- at least two lower landing pads, each of the lower landing pads on a corresponding storage node contact;
- upper landing pads respectively electrically connected to the lower landing pads; and
- a capping insulating layer between the upper landing pads and having a lower end in contact with upper surfaces of the spacer structures, wherein at least some of the upper landing pads include a first region in contact with one of the at least two bitline capping patterns and having a lower end at a first vertical depth from an upper surface, and a second region in contact with the lower landing pad and having a lower end at a second vertical depth, greater than the first vertical depth, from the upper surface, and wherein a lower surface of the capping insulating layer includes a first portion in which a horizontal separation distance is increased from one of the upper landing pads in a downward direction.

17. The semiconductor device of claim 16, wherein a portion of a lower surfaces of the upper landing pads in contact with one of the bitline capping patterns includes at least one sloped portion and/or curved portion, and wherein a portion of a lower surface of the capping insulating layer in contact with the lower landing pads includes at least one sloped portion and/or curved portion.

18. The semiconductor device of claim 17, wherein the portion of the lower surfaces of the upper landing pads have a slope such that a vertical depth of the upper landing pads is increased in a direction toward the lower landing pads, and wherein the portion of the lower surface of the capping insulating layer has a slope toward the substrate from a sidewall of the capping insulating layer in contact with a sidewall of the upper landing pads.

19. The semiconductor device of claim 16, wherein the lower end of the capping insulating layer is closer to the substrate than upper ends of the at least two bitline capping patterns.

* * * * *